US008815676B2

(12) United States Patent
Yang et al.

(10) Patent No.: US 8,815,676 B2
(45) Date of Patent: Aug. 26, 2014

(54) THREE DIMENSIONAL SEMICONDUCTOR MEMORY DEVICE AND METHOD OF FABRICATING THE SAME

(71) Applicants: Sang-Ryol Yang, Gyeonggi-do (KR); Yoo-Chul Kong, Seoul (KR); Jung-Ho Kim, Gyeonggi-do (KR); Jin-Gyun Kim, Gyeonggi-do (KR); Jae-Jin Shin, Seoul (KR); Ji-Hoon Choi, Gyeonggi-do (KR)

(72) Inventors: Sang-Ryol Yang, Gyeonggi-do (KR); Yoo-Chul Kong, Seoul (KR); Jung-Ho Kim, Gyeonggi-do (KR); Jin-Gyun Kim, Gyeonggi-do (KR); Jae-Jin Shin, Seoul (KR); Ji-Hoon Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/671,948

(22) Filed: Nov. 8, 2012

(65) Prior Publication Data
US 2013/0065369 A1 Mar. 14, 2013

Related U.S. Application Data

(63) Continuation of application No. 13/228,433, filed on Sep. 8, 2011, now Pat. No. 8,309,405.

(30) Foreign Application Priority Data

Oct. 5, 2010 (KR) .................. 10-2010-0096989

(51) Int. Cl.
*H01L 21/00* (2006.01)
(52) U.S. Cl.
USPC ............... 438/202; 257/E29.309; 257/314; 438/211

(58) Field of Classification Search
USPC .................................. 438/588–791
See application file for complete search history.

(56) References Cited

U.S. PATENT DOCUMENTS

| 3,724,065 | A | * | 4/1973 | Carbajal et al. | 438/287 |
|---|---|---|---|---|---|
| 5,308,782 | A | * | 5/1994 | Mazure et al. | 438/154 |
| 5,403,435 | A | * | 4/1995 | Cathey et al. | 438/669 |
| 5,946,230 | A | | 8/1999 | Shimizu et al. | |
| 6,274,413 | B1 | | 8/2001 | Fang et al. | |
| 6,380,032 | B1 | | 4/2002 | Lee et al. | |
| 6,483,749 | B1 | | 11/2002 | Choi et al. | |
| 7,679,133 | B2 | | 3/2010 | Son et al. | |
| 7,829,931 | B2 | | 11/2010 | Park et al. | |
| 7,884,417 | B2 | | 2/2011 | Mizukami et al. | |

(Continued)

FOREIGN PATENT DOCUMENTS

| JP | 2001 223284 A | 8/2001 |
|---|---|---|
| JP | 2008042209 | 2/2008 |

(Continued)

*Primary Examiner* — Charles Garber
*Assistant Examiner* — Evren Seven
(74) *Attorney, Agent, or Firm* — Myers Bigel Sibley & Sajovec, P.A.

(57) ABSTRACT

Methods of forming vertical nonvolatile memory devices may include forming an electrically insulating layer, which includes a composite of a sacrificial layer sandwiched between first and second mold layers. An opening extends through the electrically insulating layer and exposes inner sidewalls of the first and second mold layers and the sacrificial layer. A sidewall of the opening may be lined with an electrically insulating protective layer and a first semiconductor layer may be formed on an inner sidewall of the electrically insulating protective layer within the opening. At least a portion of the sacrificial layer may then be selectively etched from between the first and second mold layers to thereby define a lateral recess therein, which exposes an outer sidewall of the electrically insulating protective layer.

18 Claims, 34 Drawing Sheets

(56) References Cited

U.S. PATENT DOCUMENTS

| | | |
|---|---|---|
| 7,902,591 B2 | 3/2011 | Kito et al. |
| 8,008,722 B2 * | 8/2011 | Kim et al. .................. 257/347 |
| 8,102,711 B2 | 1/2012 | Maejima |
| 8,119,503 B2 | 2/2012 | Lee et al. |
| 8,193,054 B2 * | 6/2012 | Alsmeier .................. 438/216 |
| 8,247,857 B2 * | 8/2012 | Ozawa et al. ............... 257/314 |
| 8,541,819 B1 * | 9/2013 | Or-Bach et al. ............ 257/211 |
| 2002/0072167 A1 | 6/2002 | Lee et al. |
| 2006/0125029 A1 | 6/2006 | Kanda |
| 2007/0158736 A1 | 7/2007 | Arai et al. |
| 2007/0173000 A1 | 7/2007 | Yamazaki |
| 2008/0029811 A1 | 2/2008 | Yun et al. |
| 2008/0073635 A1 | 3/2008 | Kiyotoshi et al. |
| 2008/0093653 A1 | 4/2008 | Park et al. |
| 2008/0135912 A1 | 6/2008 | Lee et al. |
| 2008/0173928 A1 | 7/2008 | Arai et al. |
| 2008/0253183 A1 | 10/2008 | Mizukami et al. |
| 2009/0090960 A1 | 4/2009 | Izumi et al. |
| 2009/0173981 A1 | 7/2009 | Nitta |
| 2009/0212351 A1 * | 8/2009 | Chen ........................ 257/324 |
| 2009/0242968 A1 | 10/2009 | Maeda et al. |
| 2009/0267135 A1 | 10/2009 | Tanaka et al. |
| 2009/0268524 A1 | 10/2009 | Maejima |
| 2009/0278184 A1 | 11/2009 | Yaegashi |
| 2009/0321813 A1 | 12/2009 | Kidoh et al. |
| 2010/0078701 A1 | 4/2010 | Shim et al. |
| 2010/0090267 A1 | 4/2010 | Jeong et al. |
| 2010/0097859 A1 | 4/2010 | Shim et al. |
| 2010/0105181 A1 | 4/2010 | Yun et al. |
| 2010/0108971 A1 | 5/2010 | Lee et al. |
| 2010/0109065 A1 | 5/2010 | Oh et al. |
| 2010/0112769 A1 | 5/2010 | Son et al. |
| 2010/0120214 A1 * | 5/2010 | Park et al. .................. 438/287 |
| 2010/0133599 A1 | 6/2010 | Chae et al. |
| 2010/0133606 A1 | 6/2010 | Jang et al. |
| 2010/0155810 A1 * | 6/2010 | Kim et al. .................. 257/316 |
| 2010/0155818 A1 * | 6/2010 | Cho et al. .................. 257/324 |
| 2010/0163968 A1 | 7/2010 | Kim et al. |
| 2010/0178755 A1 | 7/2010 | Lee et al. |
| 2010/0181610 A1 * | 7/2010 | Kim et al. .................. 257/314 |
| 2010/0195395 A1 | 8/2010 | Jeong et al. |
| 2010/0202197 A1 | 8/2010 | Shim |
| 2010/0213527 A1 * | 8/2010 | Shim et al. ................. 257/314 |
| 2010/0213537 A1 | 8/2010 | Fukuzumi et al. |
| 2010/0224929 A1 | 9/2010 | Jeong et al. |
| 2010/0240205 A1 * | 9/2010 | Son et al. .................. 438/588 |
| 2010/0246257 A1 | 9/2010 | Ito et al. |
| 2010/0246263 A1 | 9/2010 | Jeon et al. |
| 2010/0252873 A1 | 10/2010 | Cheng |
| 2010/0254191 A1 | 10/2010 | Son et al. |
| 2010/0327371 A1 | 12/2010 | Lee et al. |
| 2011/0065270 A1 | 3/2011 | Shim et al. |
| 2011/0076819 A1 * | 3/2011 | Kim et al. .................. 438/279 |
| 2011/0092033 A1 | 4/2011 | Arai et al. |
| 2011/0111579 A1 | 5/2011 | Kito et al. |
| 2011/0147824 A1 | 6/2011 | Son et al. |
| 2011/0156132 A1 | 6/2011 | Kiyotoshi |
| 2011/0291178 A1 | 12/2011 | Sasaki et al. |
| 2011/0316069 A1 * | 12/2011 | Tanaka et al. .............. 257/324 |
| 2012/0001250 A1 * | 1/2012 | Alsmeier .................. 257/319 |
| 2012/0003800 A1 | 1/2012 | Lee et al. |
| 2012/0039130 A1 | 2/2012 | Yoon et al. |
| 2012/0049148 A1 | 3/2012 | Fukano |
| 2012/0068255 A1 * | 3/2012 | Lee et al. .................. 257/324 |
| 2012/0267699 A1 | 10/2012 | Kiyotoshi |
| 2012/0327715 A1 | 12/2012 | Lee et al. |

FOREIGN PATENT DOCUMENTS

| | | |
|---|---|---|
| JP | 2008147664 | 6/2008 |
| JP | 2008159699 | 7/2008 |
| JP | 2008 263029 A | 10/2008 |
| JP | 2009-094214 | 4/2009 |
| JP | 2009 094236 A | 4/2009 |
| KR | 1020090047614 | 5/2009 |
| KR | 1020100009321 | 1/2010 |
| KR | 1020100024096 | 3/2010 |

* cited by examiner

THREE DIMENSIONAL SEMICONDUCTOR MEMORY DEVICE AND METHOD OF FABRICATING THE SAME

REFERENCE TO PRIORITY APPLICATION

This application is a continuation of U.S. patent application Ser. No. 13/228,433, filed Sep. 8, 2011, now U.S. Pat. No. 8,309,405, which claims the benefit of Korean Patent Application No. 10-2010-0096989, filed on Oct. 5, 2010, the contents of which are hereby incorporated herein by reference.

CROSS-REFERENCE TO RELATED APPLICATIONS

This application is related to U.S. application Ser. No. 13/165,576, filed Jun. 21, 2001, now U.S. Pat. No. 8,278,170, and U.S. application Ser. No. 13/220,376, filed Aug. 29, 2011, the disclosures of which are hereby incorporated by reference.

BACKGROUND

The present disclosure herein relates to a semiconductor device and a method of fabricating the same, and more particularly, to a three dimensional semiconductor memory device and a method of fabricating the same. Three-dimensional (3D) memory technologies are technologies for increasing a memory capacity, and also represent technologies related to three-dimensionally arranged memory cells. The memory capacity may be increased through (1) fine pattern technologies and (2) multi level cell (MLC) technologies. However, the fine pattern technologies may be accompanied with high cost, and the MLC technologies may be limited by the number of increasable bits per cell. For this reason, it seems that 3D technologies are a necessary way of increasing memory capacity. In addition, when the fine pattern technologies and the MLC technologies are combined with the 3D memory technologies, the memory capacity can be further increased. Thus, it is expected that the fine pattern technologies and the MLC technologies are developed as technologies independent of the 3D memory technologies.

Recently, a punch-and-plug technology was proposed as one of the 3D memory technologies. The punch-and-plug technology includes sequentially forming multi-layered thin films on a substrate and forming plugs passing through the multi-layered thin films When the punch-and-plug technology is applied, the memory capacity of 3D memory devices may be largely increased without significantly increasing fabrication costs. Therefore, the punch-and-plug technology is in the spotlight in recent years.

SUMMARY

Methods of forming vertical nonvolatile memory devices according to embodiments of the invention may include techniques to form three-dimensional (3D) stacks of nonvolatile memory cells. According to some of these embodiments of the invention, a method of forming a nonvolatile memory device may include forming an electrically insulating layer containing a vertical stack of layers on a semiconductor substrate. This electrically insulating layer may include a composite of: (i) a sacrificial layer having upper and lower surfaces; and (ii) first and second mold layers, which extend directly on the upper and lower surfaces. Steps may also be performed to form an opening extending through the electrically insulating layer. This opening may expose inner sidewalls of the first and second mold layers and the sacrificial layer. A sidewall of the opening may be lined with an electrically insulating protective layer and a first semiconductor layer may be formed on an inner sidewall of the electrically insulating protective layer within the opening. At least a portion of the sacrificial layer may then be selectively etched from between the first and second mold layers to thereby define a lateral recess therein, which exposes an outer sidewall of the electrically insulating protective layer. This exposed outer sidewall of the electrically insulating protective layer is then selectively etched to expose a portion of the first semiconductor layer. A gate dielectric layer is then formed on the exposed portion of the first semiconductor layer and a gate electrode is formed on the gate dielectric layer.

According to additional embodiments of the invention, the step of forming a gate dielectric layer may include forming a composite of a tunnel insulating layer, a charge storage layer and an electrically insulating blocking layer on a portion of the first semiconductor layer exposed by the lateral recess. In particular, the step of forming a gate dielectric layer may include lining the exposed portion of the first semiconductor layer in the recess and the exposed portions of the first and second mold layers in the recess with the tunnel insulating layer.

According to further embodiments of the invention, the step of forming an opening may be preceded by forming a capping mask pattern on the first mold layer. This capping mask pattern may be used as an etching mask during the step of forming the opening. In addition, a step may be provided to laterally recess the exposed inner sidewalls of the first and second mold layers and the sacrificial layer in the opening, using the capping mask pattern as an etching mask. Thereafter, the step of lining the sidewall of the opening with an electrically insulating protective layer may include lining the recess hole and the recessed inner sidewalls of the first and second mold layers and the sacrificial layer with the electrically insulating protective layer. In addition, the step of forming a semiconductor layer on an inner sidewall of the electrically insulating protective layer may be preceded by selectively removing the electrically insulating protective layer from the recess hole in the substrate. This selective removal may be achieved by selectively implanting etch-enhancing impurities into a portion of the electrically insulating protective layer in the recess hole, using the capping mask pattern as an implant mask. The step of forming a semiconductor layer on an inner sidewall of the electrically insulating protective layer may also include depositing the semiconductor layer into the recess hole.

According to still further embodiments of the invention, a method of forming a nonvolatile memory device includes forming a vertical stack of a plurality of sacrificial layers and a plurality of electrically insulating mold layers, which are arranged in an alternating sequence, on a substrate. A step is then performed to selectively etch through the vertical stack to thereby define an opening therein that exposes the substrate and recesses inner sidewalls of the plurality of sacrificial layers relative to inner sidewalls of the plurality of mold layers. The recessed inner sidewalls of the plurality of sacrificial layers and the inner sidewalls of the plurality of mold layers are then lined with an electrically insulating protective layer. However, this protective layer is then selectively removed from the inner sidewalls of the plurality of mold layers to define protective spacers on the recessed inner sidewalls of the plurality of sacrificial layers. A semiconductor active layer is formed on inner sidewalls of the protective spacers, the inner sidewalls of the plurality of mold layers and on the exposed substrate. Portions of the plurality of sacrificial layers are then selectively removed from the vertical stack to define recesses between the plurality of mold layers and expose the protective spacers within the recesses. Gate electrodes are then formed on the exposed protective spacers, in the recesses.

According to additional embodiments of the invention, a method of forming a nonvolatile memory device includes forming an electrically insulating layer on a substrate. This electrically insulating layer includes a composite of a sacrificial layer having upper and lower surfaces and first and second mold layers extending directly on the upper and lower surfaces, respectively. A capping mask pattern is formed on the electrically insulating layer, before a selective etching step is performed to define an underlying opening using the capping mask pattern as an etching mask. This opening, which extends through the electrically insulating layer and into the substrate, exposes inner sidewalls of the first and second mold layers and the sacrificial layer and defines a recess hole within the substrate. These exposed inner sidewalls of the first and second mold layers and the sacrificial layer are then selectively laterally etched relative to a sidewall of an opening in the capping mask pattern, to thereby define an undercut region within the opening in the electrically insulating layer. The recessed inner sidewalls of the first and second mold layers and the sacrificial layer in the undercut region are then lined with an electrically insulating protective layer. This electrically insulating protective layer may be thinned before forming a semiconductor layer on the electrically insulating protective layer.

According to additional aspects of these embodiments of the invention, the step of lining the recessed inner sidewalls of the first and second mold layers and the sacrificial layer includes lining the recess hole with the electrically insulating protective layer. In addition, the step of thinning the electrically insulating protective layer may include selectively implanting etch-enhancing dopants into a first portion of the electrically insulating protective layer within the recess hole and then etching the first portion of the electrically insulating protective layer (containing the dopants) at a faster rate relative to a second portion of the electrically insulating protective layer (without dopants) on the recessed inner sidewalls of the first and second mold layers and the sacrificial layer. The sacrificial layer may also be replaced with a gate electrode. This replacement may be achieved by removing the sacrificial layer to define a lateral recess extending between the first and second mold layers, which exposes a portion of the electrically insulating protective layer. The exposed portion of the electrically insulating protective layer may then be removed to thereby expose a portion of the semiconductor layer. A gate insulating layer, which contains a composite of a tunnel oxide layer and a charge storage layer, may be formed on the exposed portion of the semiconductor layer prior to forming the gate electrode on the gate insulating layer.

According to still further embodiments of the invention, a method of forming a vertical nonvolatile memory device includes forming a vertical stack of a plurality of gate electrode layers and a plurality of electrically insulating mold layers arranged in an alternating sequence, on a substrate. A capping mask pattern is formed on the vertical stack, before a first opening, which extends through the vertical stack and into the substrate, is selectively etched using the capping mask pattern as an etching mask. This first opening exposes inner sidewalls of the gate electrode layers and the plurality of electrically insulating mold layers and also exposes a recess hole within the substrate. The exposed inner sidewalls of the gate electrode layers and the plurality of electrically insulating mold layers are then selectively etched relative to a sidewall of a second opening in the capping mask pattern to thereby define an undercut region within the first opening. The recessed inner sidewalls of the plurality of gate electrode layers and the inner sidewalls of the plurality of mold layers are then lined with an electrically insulating protective layer. A first semiconductor active layer is then formed on an inner sidewall of the electrically insulating protective layer in advance of forming a second semiconductor active layer on an inner sidewall of the first semiconductor active layer and in the recess hole. According to some aspects of these embodiments of the invention, the electrically insulating protective layer comprises a composite of a tunnel insulating layer, a charge storage layer, a barrier dielectric layer and a charge blocking layer. This barrier dielectric layer may include a material having a greater bandgap relative to the charge blocking layer.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
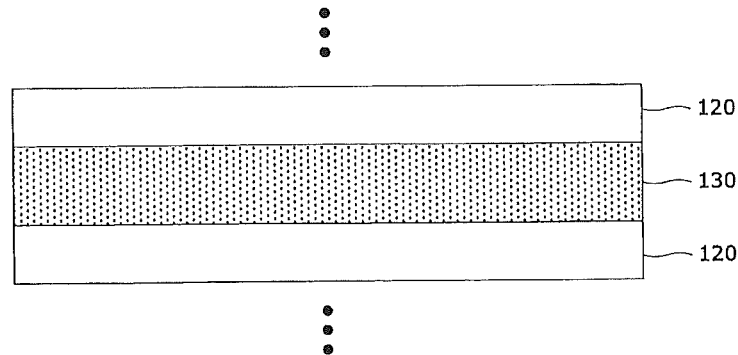
FIGS. 1 to 8 are sectional views for explaining a method of fabricating a three dimensional semiconductor device realizing a first aspect of the inventive concept.

Exemplary embodiments of the inventive concept will be described below in more detail with reference to the, accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the specification, it will be understood that when a layer (or film) is referred to as being 'on' another layer or substrate, it can be directly on the other layer or substrate, or intervening layers may also be present. Also, in the figures, the dimensions of layers and regions are exaggerated for clarity of illustration. Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in other embodiments. Some embodiments described and exemplified herein includes a complementary embodiment thereof.

A three dimensional semiconductor device according to embodiments of the inventive concept may include a cell array region, a peripheral circuit region, a sense amplifier region, a decoding circuit region, and a connection region. A plurality of memory cells and bit lines and word lines, which electrically connect the memory cells to each other, are disposed in the cell array region. Also, circuits for operating the memory cells are disposed in the peripheral circuit region, and circuits for reading information stored in the memory cells are disposed in the sense amplifier region. The connection region may be defined between the cell array region and the decoding region. A wiring structure electrically connecting the word lines to the decoding circuit region may be disposed in this connection region.

Hereinafter, technical features related to a portion of the cell array region of the three dimensional (3D) semiconductor device will be mainly described. Technical features related to other regions as well as the cell array region are disclosed in Korean Application No. 2009-0126854 filed on Dec. 18, 2009, Korean Application No. 2010-0014751 filed on Feb. 18, 2010, Korean Application No. 2010-0006124 filed on Jan. 22, 2010, Korean Application No. 2009-0099370 filed on Oct. 19, 2009, and U.S. application Ser. No. 12/480,399 filed on Jun. 8, 2009, the entire contents of which are hereby incorporated herein by reference.

In addition, a constitution in which a process of forming a memory structure is repeatedly performed to form a multi-layered memory structure is disclosed in Korean Application No. 2010-0006124. The inventive concept may be realized by expanding the embodiments including the constitution in which the process of forming the memory structure that will be described below is repeatedly performed to form the multi-layered memory structure.

Figure 2:
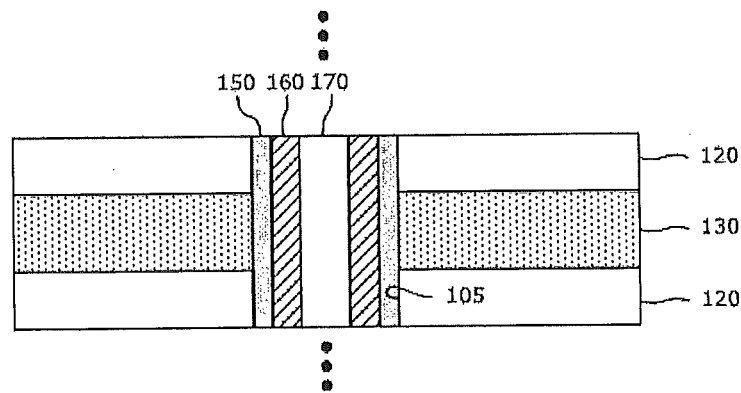
Figure 3:
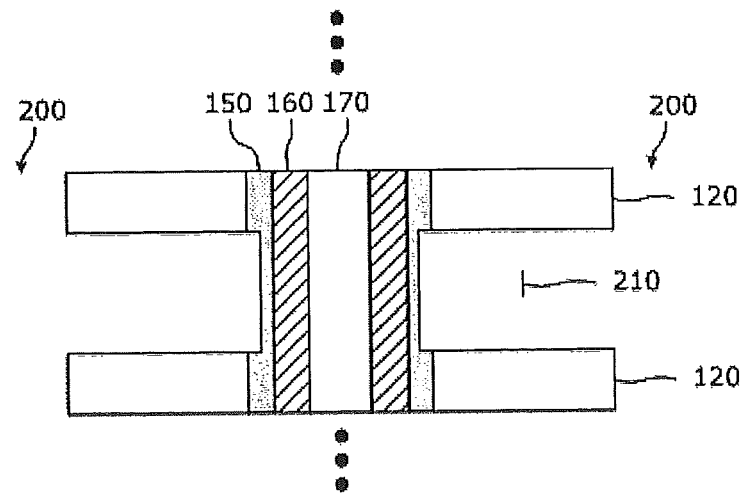
Figure 4:
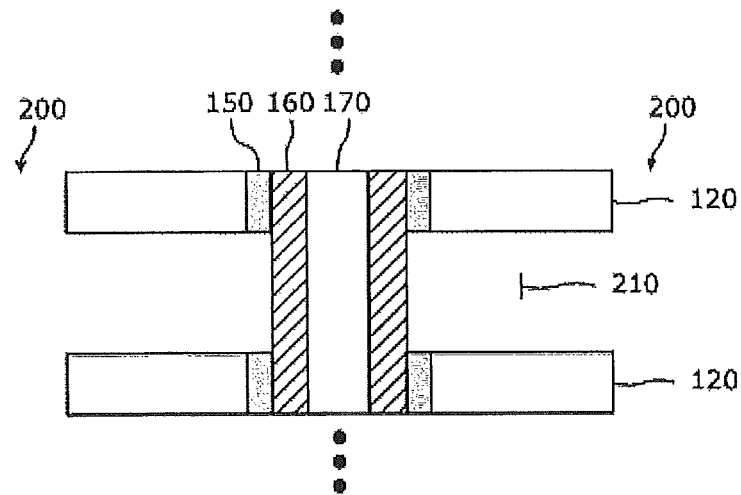

FIGS. 1 to 8 are sectional views for explaining a method of fabricating a three dimensional semiconductor device realizing a first aspect of the inventive concept. Referring to FIG. 1, first layers 120 (or molding layers) and second layers 130 (or sacrificial layers) are sequentially and alternately deposited on a substrate (not shown). Thus, as shown in FIG. 4, the sacrificial layers may be disposed between the vertically stacked molding layers 120. The sacrificial layers 130 may be formed of a material having an etch selectivity relative to the molding layers 120. That is, the sacrificial layers may be formed of a material, which is removed while it substantially prevents the molding layers 120 from being etched. For example, when the molding layers 120 are a silicon oxide layer, the sacrificial layers 130 may be a silicon nitride layer. Hereinafter, the term "etch selectivity" between the thin films a and b may be quantitatively expressed by a ratio of an etch rate of the selected thin film a to an etch rate of the non-selected thin film b in a used etch recipe. Also, "having the etch selectivity" may be understood as meaning that a difference between the etch rates is substantially and sufficiently large.

Referring to FIG. 2, an opening 105 passing through the molding layers 120 and the sacrificial layers 130 is formed to form insulative protective layers 150 and semiconductor layers 160, which sequentially cover inner walls of the opening 105. According to some embodiments, a gap-fill layer 170 filling the opening 105 on which the semiconductor layers 160 are formed may be further formed.

The insulative protective layer 150 may be formed of a material having an etch selectivity relative to the sacrificial layer 130. The insulative protective layer 150 may be variously changed in its thickness and material according to a material of the semiconductor layer 160 and a structure of the thin film. According to some embodiments, the insulative protective layer 150 may be formed of at least one of silicon oxide, silicon oxide containing nitrogen, silicon oxynitride, and high-k dielectrics. Since the insulative protective layer 150 is formed through fabrication processes (or deposition processes) different from those for forming the molding layers 120, the insulative protective layer 150 may be different from the molding layers 120 in at least one of a chemical composition, a density, and an impurity concentration contained therein, or a discontinuous interface may be formed between the insulative protective layer 150 and the molding layers 120.

Referring to FIG. 3, the molding layers 120 and the sacrificial layers 130 are patterned to form a trench 200 exposing sidewalls of the IPL 150. The trench 200 may penetrate through the molding layers 120 and the sacrificial layers 130. Sequentially, the sacrificial layers 130 exposed by the trench 200 are selectively removed to form a recess region 210 exposing the sidewall of the insulative protective layer 150. A process of forming the recess region 210 may include a process of isotropically etching the sacrificial layer 130 using an etch recipe having an etch selectivity relative to the molding layer 120 and the insulative protective layer 150. For example, when the molding layer 120 and the sacrificial layer 130 are a silicon oxide layer and a silicon nitride layer, respectively, the recess region 210 may be formed using an etchant containing phosphoric acid. When the molding layer 120 and the insulative protective layer 150 do not have a sufficiently high etch selectivity relative to the sacrificial layer 130 in the etch recipe, as shown in FIG. 3, a surface of the insulative protective layer 150 adjacent to the sacrificial layer 130 may be partially recessed during the etching of the sacrificial layer 130.

Figure 5:
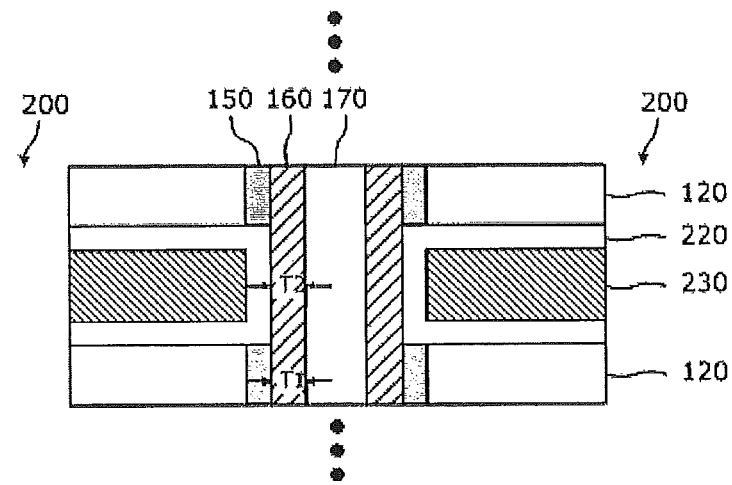

Thereafter, as shown in FIG. 4, the exposed portion of the insulative protective layer 150 is selectively removed to expose a surface of the semiconductor layer 160 adjacent to the insulative protective layer 150. Then, as shown in FIG. 5, an information storage layer 220 and a conductive pattern 230 may be sequentially formed to cover the exposed surface of the semiconductor layer 160. The information storage layer 220 may horizontally extend to cover upper and lower surfaces of the conductive pattern 230 as shown in FIG. 5.

A process of exposing the surface of the semiconductor layer 160 may be performed using the etch recipe having the etch selectivity relative to the semiconductor layer 160. According to some embodiments, the etch recipe may be selected to have the etch selectivity relative to the molding layer 120.

According to other embodiments, the molding layer 120 and the insulative protective layer 150 may be formed of materials, which do not have a sufficiently high etch selectivity, respectively. That is, both the molding layer 120 and the insulative protective layer 150 may be etched while the surface of the semiconductor layer 160 is exposed. In this case, while the exposed portion of the insulative protective layer 150 is removed, a thickness of the recess region 210 (i.e., a distance between two molding layers vertically adjacent to each other) may become greater than an initially deposited thickness of the sacrificial layer 130.

Figure 6:
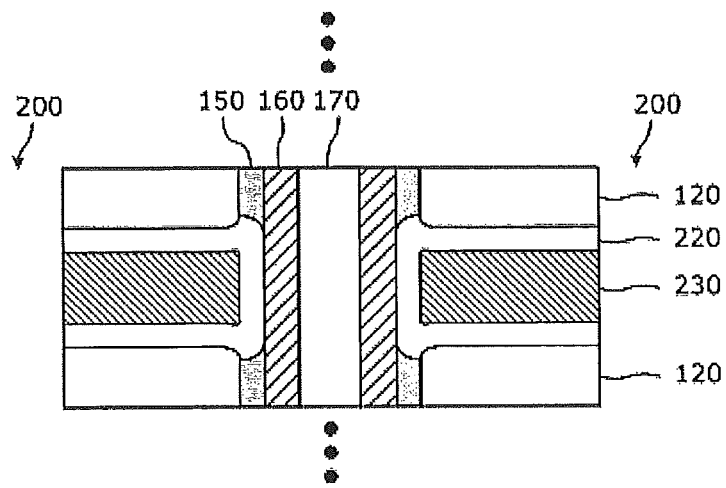
Figure 7:
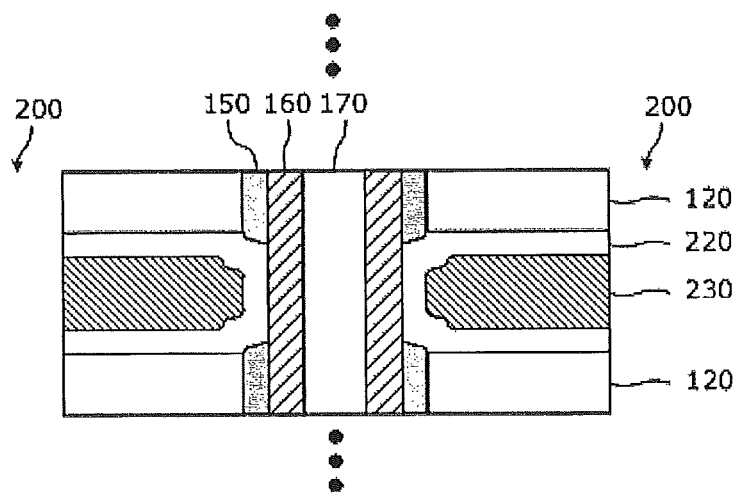

The molding layer 120 and the insulative protective layer 150 may have etch rates different from each other. For example, when the insulative protective layer 150 has an etch rate greater than that of the molding layer 120, the insulative protective layer 150 may have a vertical thickness less than that of the molding layer 120 in mean value. In this case, as shown in FIG. 6, a portion of the information storage layer 220 may extend between the sidewalls of the molding layer 120 and the semiconductor layer 160. On the other hand, when the insulative protective layer 150 has an etch rate less than that of the molding layer 120, the insulative protective layer 150 may have a vertical thickness greater than that of the molding layer 120. That is, as shown in FIG. 7, the insulative protective layer 150 may have a portion extending between the sidewalls of the information storage layer 220 and the semiconductor layer 160.

Figure 8:
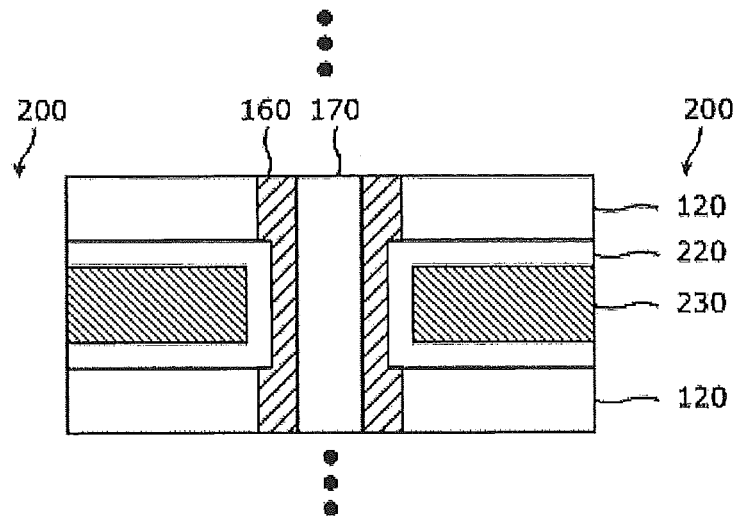

According to a modified embodiment of the inventive concept, before the semiconductor layer 160 is formed, a process of forming the insulative protective layer 150 may be omitted. In this case, as shown in FIG. 8, the semiconductor layer 160 may be in direct contact with the molding layer 120. However, when the semiconductor layer 160 is formed of a material, which does not have a sufficiently high etch selectivity relative to the sacrificial layer 130, the surface of the semiconductor layer 160 may be recessed during the formation of the recess region 210. It may be necessary to prevent the surface of the semiconductor layer 160 from being recessed, if product characteristics of a semiconductor device is significantly dependent on thickness uniformity of the semiconductor layer 160.

In the meantime, according to some embodiments, a plurality of openings 105 in which distances spaced from the trench 200 are different from each other and the semiconductor layers 160 filling the plurality of openings 105 may be formed between a pair of adjacent trenches 200. For example, two to eight semiconductor layers 160 in which the distances spaced from the trench 200 are different from each other may be formed between the pair of adjacent trenches 200. For this structure, an etching damage on the semiconductor layer 160 and non-uniformity of thickness may be further intensified. That is, since, the more the semiconductor layer 160 is exposed to an etching material used for forming the recess region 210 for a long time, the more the etching damage with respect to the semiconductor layer 160 is increased, as the semiconductor layer 160 is gradually adjacent to the trench 200, the etching damage with respect to the semiconductor layer 160 may be further increased.

As above-described with reference to FIGS. 1 to 7, the insulative protective layer 150 is disposed between the sacrificial layer 130 and the semiconductor layer 160 to prevent the semiconductor layer 160 from being damaged during the formation of the recess region 210. Thus, unlike the embodiment described with reference to FIG. 8, the thickness uniformity of the semiconductor layer 160 may be secured. For example, as illustrated by FIG. 5, according to some embodiments, a difference (i.e., T1−T2) between a thickness T1 of the semiconductor layer 160 measured on the sidewall of the insulative protective layer 150 and a thickness T2 of the semiconductor layer 160 measured on the sidewall of the information storage layer 220 may be less than about ⅒ of an average thickness of the semiconductor layers 160.

Figure 9:
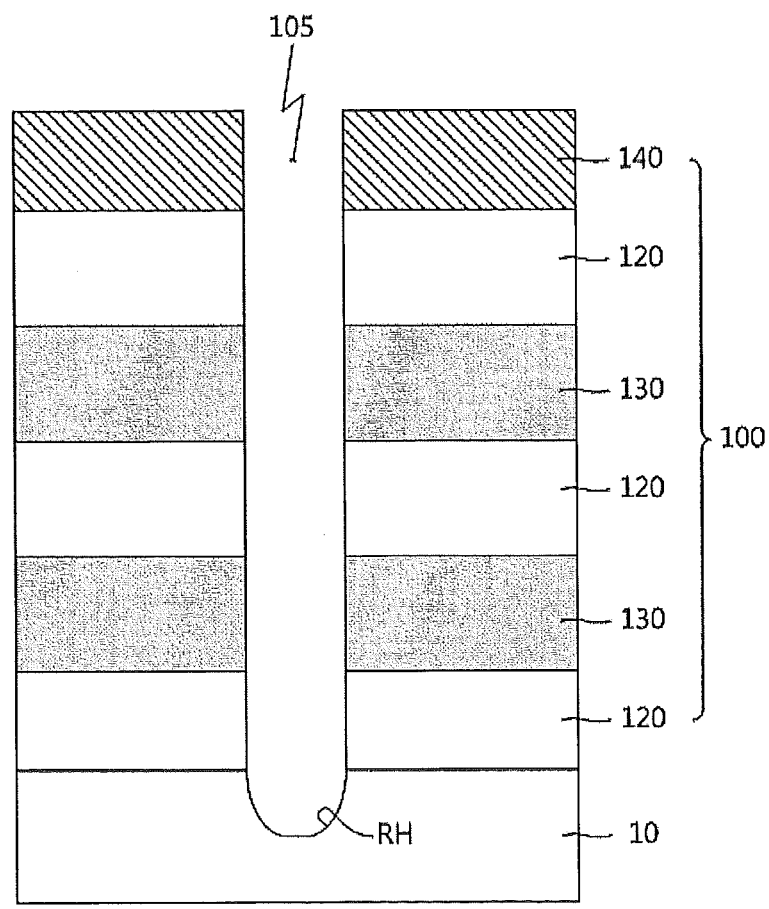
FIGS. 9 to 15 are sectional views for explaining a method of fabricating a three dimensional semiconductor device realizing a second aspect of the inventive concept.

FIGS. 9 to 15 are sectional views for explaining a method of fabricating a three dimensional semiconductor device realizing a second aspect of the inventive concept. FIG. 16 is a graph illustrating exemplary an etch rate depending on an impurity concentration. Referring to FIG. 9, a stacked layer structure 100 is formed on a substrate 10, and then, an opening 105 passing through the stacked layer structure 100 is formed. The stacked layer structure 100 may include first layers 120 (or molding layers) and second layers 130 (or sacrificial layers), which are sequentially and alternately formed. In addition, the stacked layer structure 100 may further include a capping mask layer 140 formed on an uppermost portion thereof. The first layer 120 may be formed of a material having an etch selectivity relative to the second layer 130. Also, the capping mask layer 140 may be formed of a material having an etch selectivity relative to all of the first and second layers 120 and 130. That is, in a chemical composition and a physical structure, the first and second layers 120 and 130 may be formed materials different from each other, and the capping mask layer 140 may be formed of a material different from those of the first and second layers 120 and 130. For example, the first layer 120, the second layer 130, and the capping mask layer 140 may be formed of one selected from silicon oxide, silicon nitride, silicon oxynitride, silicon germanium, silicon, and carbide, while the first layer 120, the second layer 130, and the capping mask layer 140 may satisfy the requirement of the above-described etch selectivity. According to some embodiments, the first layer 120 may be formed of silicon oxide, and the second layer 130 may be formed of silicon nitride. Also, the capping mask layer 140 may be formed of at least one of silicon, silicon carbide, and silicon germanium.

The opening 105 may be formed to recess a top surface of the substrate 10. Thus, a recess hole RH may be formed in the substrate 10 disposed below the opening 105. Although the recess hole RH may have a width gradually narrow toward the bottom as shown in FIG. 9, the recess hole may be variously changed in shape.

Figure 10:
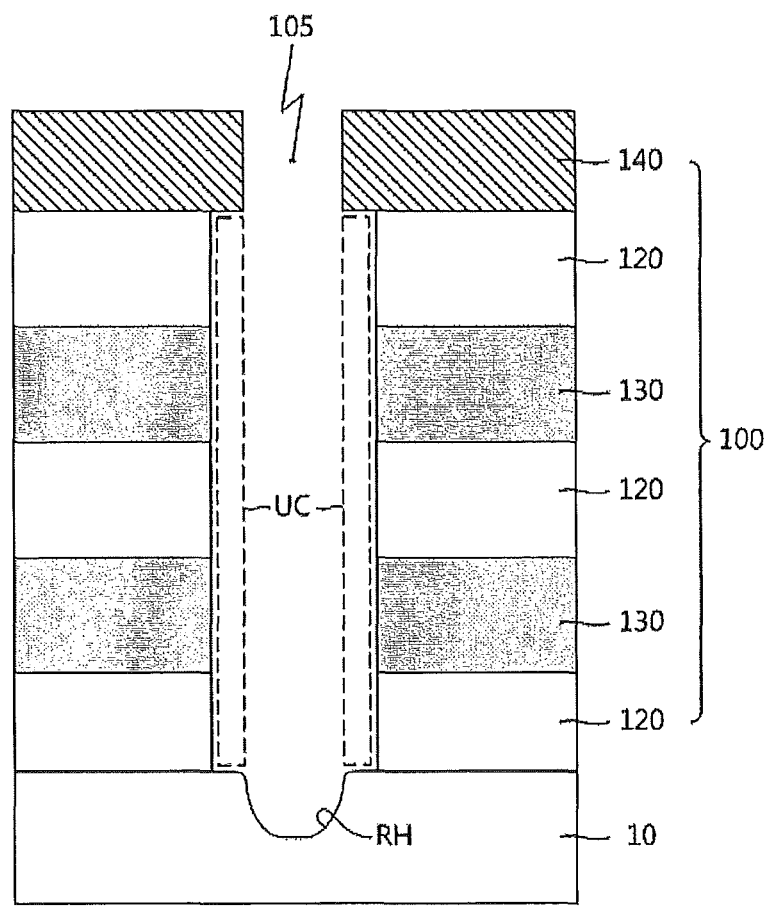

Referring to FIG. 10, the sidewalls of the first and second layers 120 and 130 exposed by the opening 105 are horizontally etched using the capping mask layer 140 as an etch mask. Thus, as shown in FIG. 10, undercut regions UC may be defined between the capping mask layer 140 and the substrate 10. In a horizontal aspect, the undercut region UC may be defined between the first and second layers 120 and 130 and the opening 105. A process of forming the undercut region UC may include a process of isotropically etching the first and second layers 120 and 130 using an etch recipe having an etch selectivity relative to the substrate 10. This process may be performed by simultaneously etching the first and second layers 120 and 130 or successively etching one of the first and second layers 120 and 130 and the other one. For example, after the first layer 120 is etched, the second layer 130 may be etched to form the undercut region UC. In this case, the undercut region UC may have a wide width around the second layer 130 than around the first layer 120.

Figure 11:
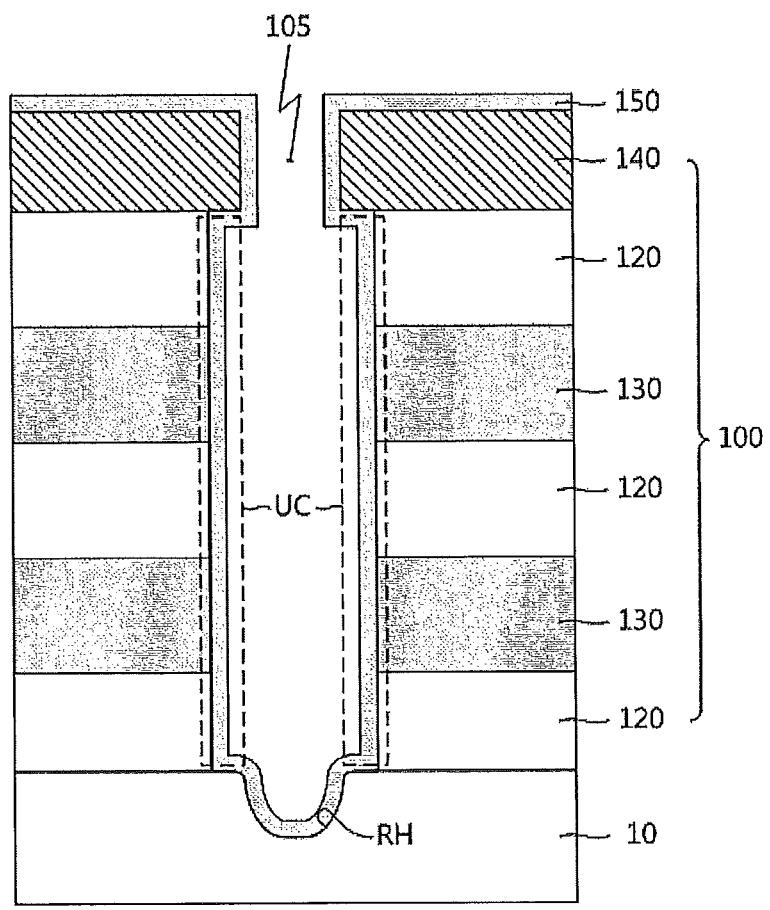

Referring to FIG. 11, an insulative protective layer 150 is formed on the result including the undercut region UC. The insulative protective layer 150 may be conformally formed with a thickness less than a width (a distance between the opening 105 and outer walls of the undercut region UC) of the undercut region UC. Thus, the insulative protective layer 150 covers the sidewalls of the first and second layers 120 and 130 and an inner wall of the recess hole RH. Here, a portion of the insulative protective layer 150 covering the sidewalls of the first and second layers 120 and 130 is formed within the undercut region UC shadowed by the capping mask layer 140. According to some embodiments, the insulative protective layer 150 may be formed of a material having an etch selectivity relative to the first or second layer 120 or 130. For example, the insulative protective layer 150 may be formed of a material different from that of the second layer 130. In detail, the insulative protective layer 150 may be formed of at least one of silicon oxide, silicon oxide containing nitrogen, silicon oxynitride, and high-k dielectrics. Meanwhile, since the insulative protective layer 150 is formed through fabrication processes (or deposition processes) different from those for forming the first layer 120, the insulative protective layer 150 may be different from the first layer 120 in at least one of a chemical composition, a density, and an impurity concentration contained therein, or a discontinuous interface may be formed between the insulative protective layer 150 and the first layers 120.

Figure 12:
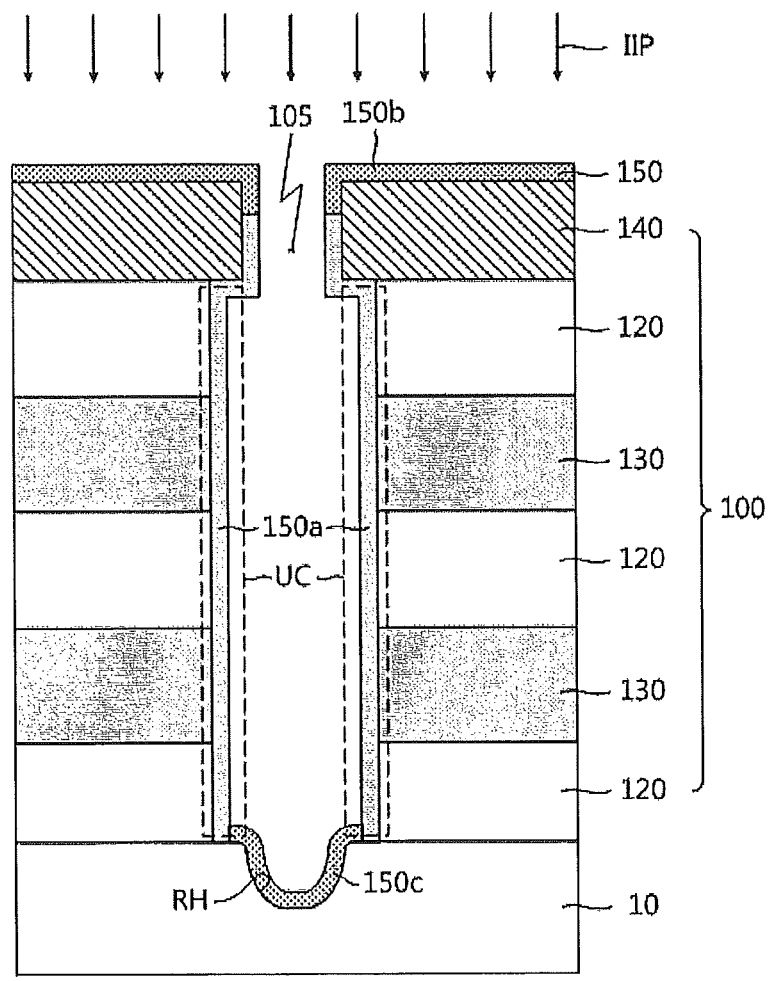

Referring to FIG. 12, impurities are injected into a portion 150c (hereinafter, referred to as a third portion) covering the recess hole RH of the insulative protective layer 150. The injection of the impurities may be restrained at a portion 150a (hereinafter, referred to as a first portion) of the insulative protective layer 150 covering the sidewalls of the first and second layers 120 and 130. According to some embodiments, the injection of the impurities may be performed using an ion injection process IIP, which uses the capping mask layer 140 as an ion-mask. In this case, the impurities may be injected into a portion 150b (hereinafter, referred to as a second portion) of the insulative protective layer 150 covering the capping mask layer 140. However, since the capping mask layer 140 is used as the ion-mask, the injection of the impurities into the first portion 150a may be restrained as described above. Therefore, the insulative protective layer 150 includes the plurality of portions having impurity concentrations different from each other. According to some embodiments, to realize the difference of the impurity concentration, the impurities used in the ion injection process IIP may be substantially vertically injected into the top surface of the substrate 10.

Figure 13:
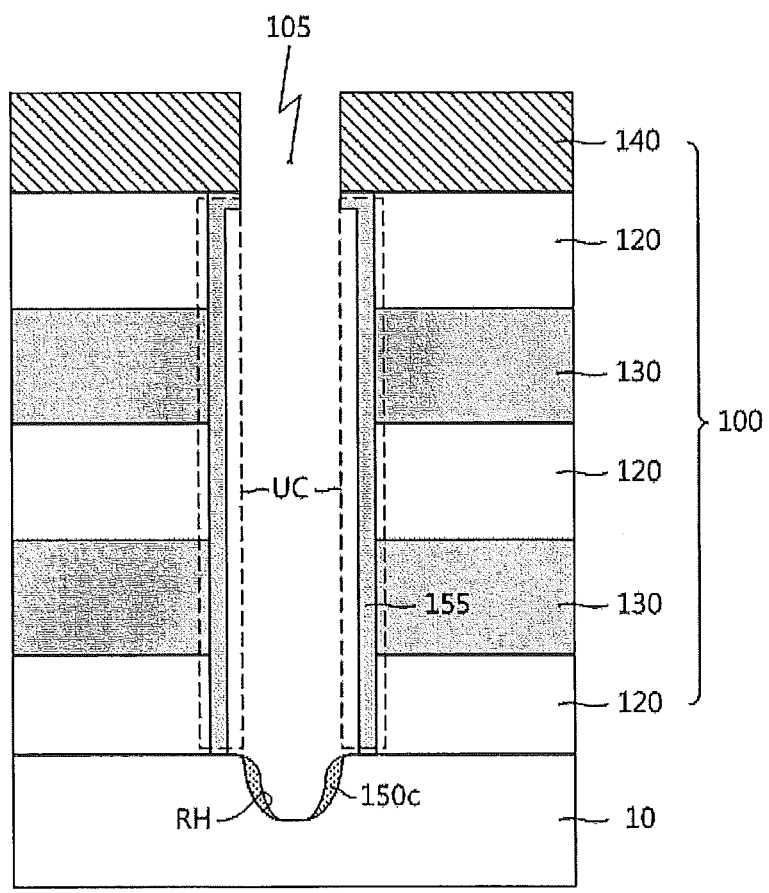
Figure 14:
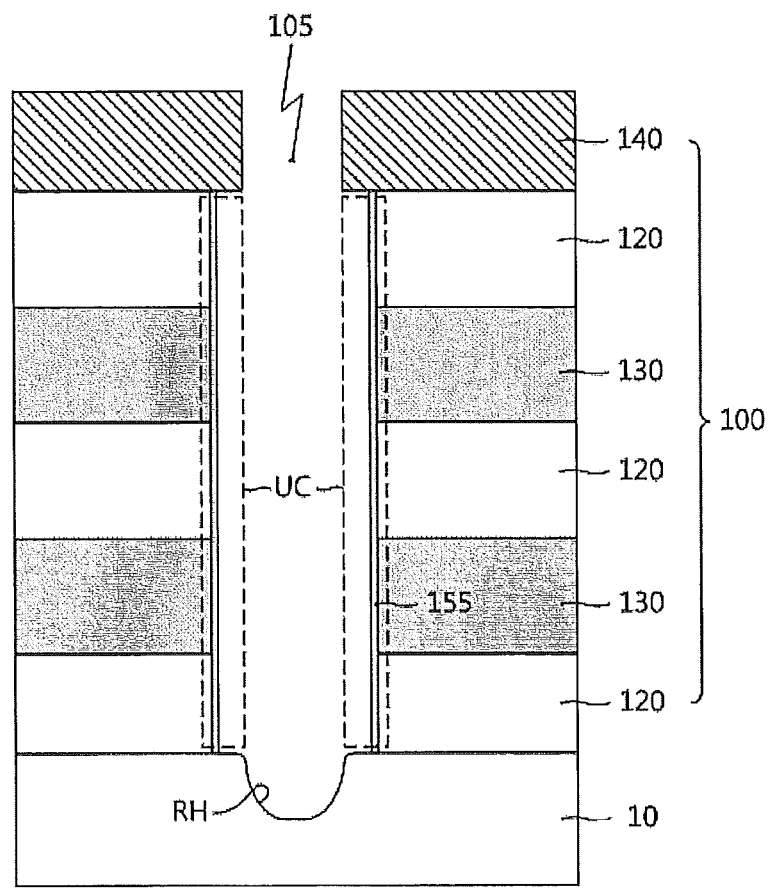

Thereafter, as illustrated by FIG. 13, the first portion 150a of the insulative protective layer 150 remains within the undercut region UC, and also the third portion 150c of the insulative protective layer 150 is selectively removed. Thus, the entire inner wall (i.e., a bottom surface and a sidewall) of the recess hole RH may be exposed. According to some embodiments, as shown in FIG. 14, this process may include a process of isotropically etching the insulative protective layer 150 using an etch recipe having an etch selectivity relative to the capping mask layer 140 and the substrate 10. In this case, due to the above-described spatial difference of the impurity concentration, the third portion 150c of the insulative protective layer 150 may be selectively removed and an insulating spacer 155 may locally remain within the undercut region UC.

The selective removal process illustrated by FIG. 14 will be described in detail with reference to FIG. 16. As shown by FIG. 16, etch rates of silicon oxide layers, in which boron ions were injected, were measured. An etchant and an ion energy used for the experiments were the same. A horizontal axis of the graph represents an etch time, and a vertical axis represents an etch amount. In the graph, curves C1, C2, and C3 represents results obtained from samples in which boron was injected with doses of about 0, about 5.0×1012, and about 5.0×1014, respectively. As shown in FIG. 16, the etch rate was higher in the doped samples C2 and C3 than in the undoped sample C1. Particularly, comparing curve C1 to curve C3, an etch amount difference of about 50 Å was obtained during the etch time of about 80 seconds to about 100 seconds. That is, a difference of the impurity concentration resulted in a difference of the etch rate. Thus, as described with reference to FIG. 13, the undoped first portion 150a may remain within the undercut region UC while the doped third portion 150c is selectively removed.

According to modified embodiments, as shown in FIG. 13, a process of anisotropically etching the insulative protective layer 150 may be further performed before the insulative protective layer 150 is isotropically etched. This process may be performed using the capping mask layer 140 as an etch mask. Thus, the insulative protective layer 150 may be removed at the bottom of the recess hole RH and over the capping mask layer 140 to remain within the undercut region UC. Due to the result of the anisotropic etch process, the insulative protective layer 150 may remain on the sidewall of the recess hole RH. The third portion 150c of the insulative protective layer 150 remaining on the sidewall of the recess hole RH may be removed in the isotropic etch process described with reference to FIG. 14.

Figure 15:
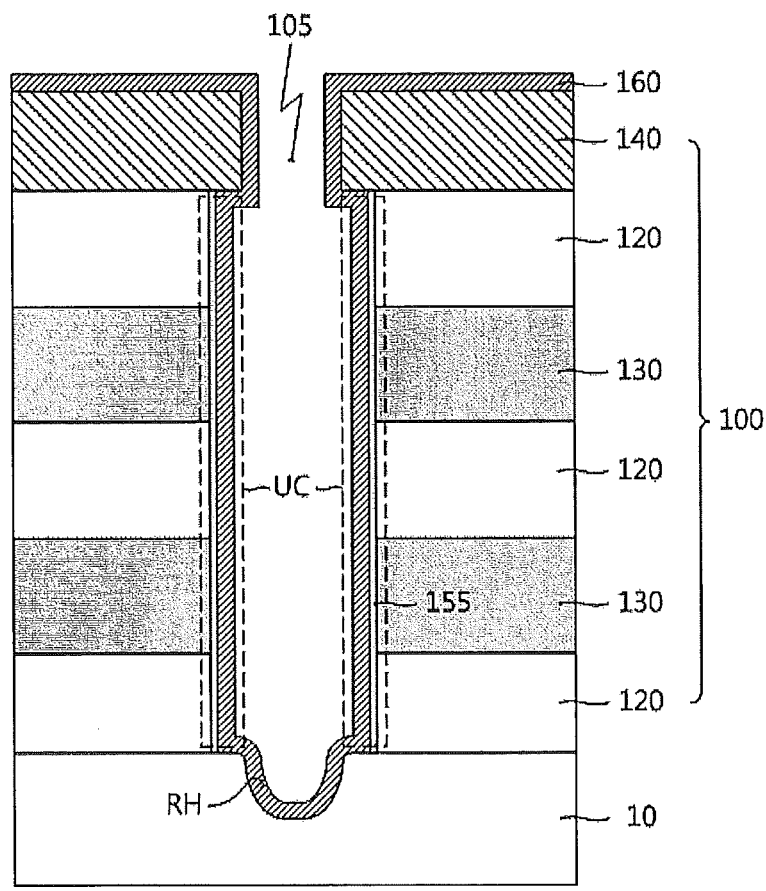
Figure 16:
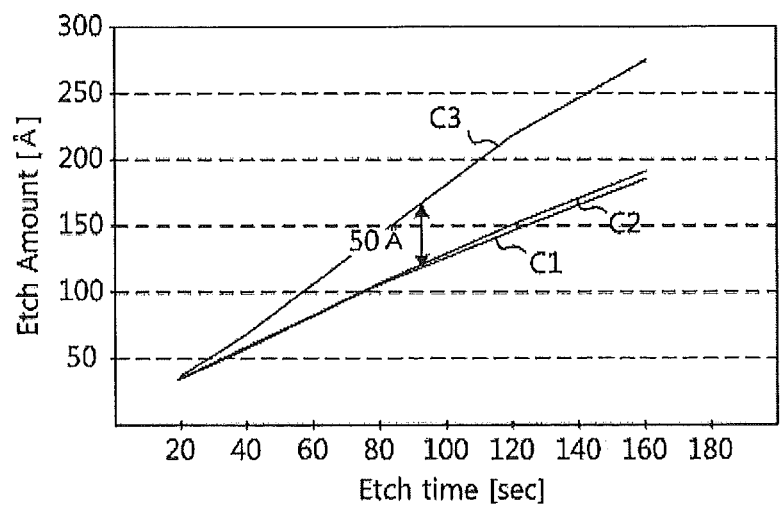
FIG. 16 is a graph illustrating exemplary an etch rate depending on an impurity concentration.

Referring to FIG. 15, a semiconductor layer 160 is formed on the result including the insulating spacer 155. The semiconductor layer 160 may substantially conformally cover an inner wall of the recess hole RH and an inner wall of the insulating spacer 155. According to some embodiments, the semiconductor layer 160 may be a silicon layer formed using a chemical vapor deposition (CVD) or atomic layer deposition (ALD) technology.

According to the third aspect of the inventive concept, an insulating spacer 155 may contribute to the overcome of technically difficulties in a deposition process of a semiconductor layer 160. According to other experiments performed by the inventors, the deposition process of the semiconductor layer 160 was dependent on physical properties of an underlayer, which is covered by the semiconductor layer 160. For example, a time (or an incubation time) required for forming the semiconductor layer 160 having a predetermined thickness or thickness uniformity of the semiconductor layer 160 may depend on the physical properties of the underlayer. Furthermore, when the semiconductor layer 160 is a polysilicon formed using a CVD or ALD technology, the incubation time and thickness uniformity of the semiconductor layer 160 may be superior in case of the silicon nitride layer than the silicon oxide layer. Considering the experimental results, according to some embodiments of the inventive concept, the insulating spacer 155 or the insulative protective layer 150 may be formed of oxide containing nitrogen, silicon oxynitride, or silicon nitride.

Figure 17:
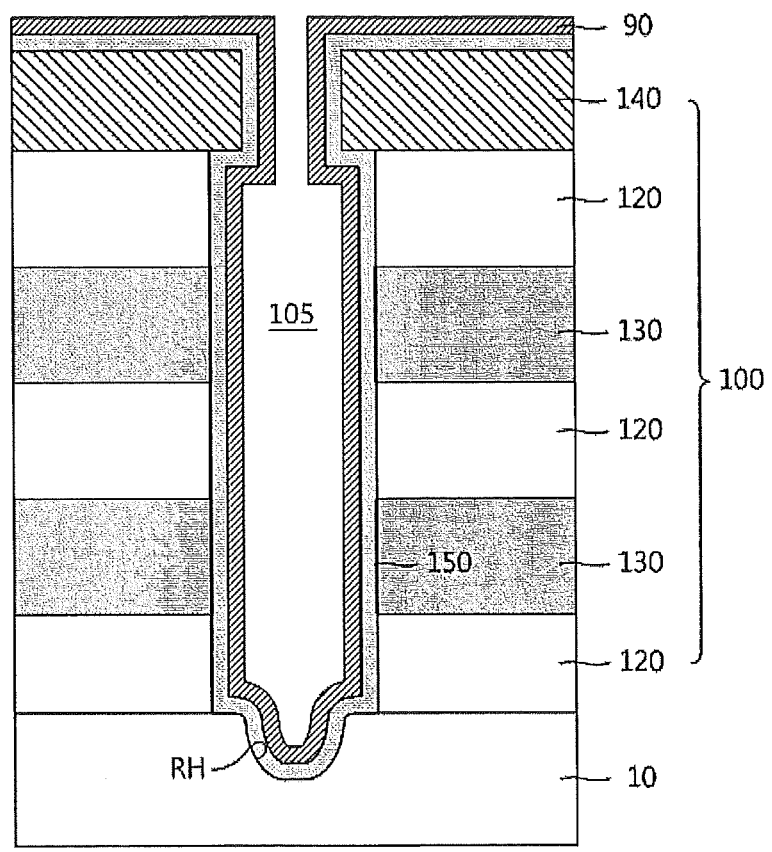
FIGS. 17 to 20 are sectional views for explaining a method of fabricating a three dimensional semiconductor device realizing a fourth aspect of the inventive concept.

FIGS. 17 to 20 are sectional views for explaining a method of fabricating a three dimensional semiconductor device realizing a fourth aspect of the inventive concept. For brief explanations, descriptions of technical features duplicated with the method described with reference to FIGS. 9 to 15 may be omitted. Referring to FIG. 17, an auxiliary mask layer 90 conformally covering an insulative protective layer 150 is formed before an ion injection process IIP is performed. According to some embodiments, the auxiliary mask layer 90 may be formed of a material having semiconductor characteristics. For example, the auxiliary mask layer 90 may be a multi-silicon layer formed using a deposition technology.

Figure 18:
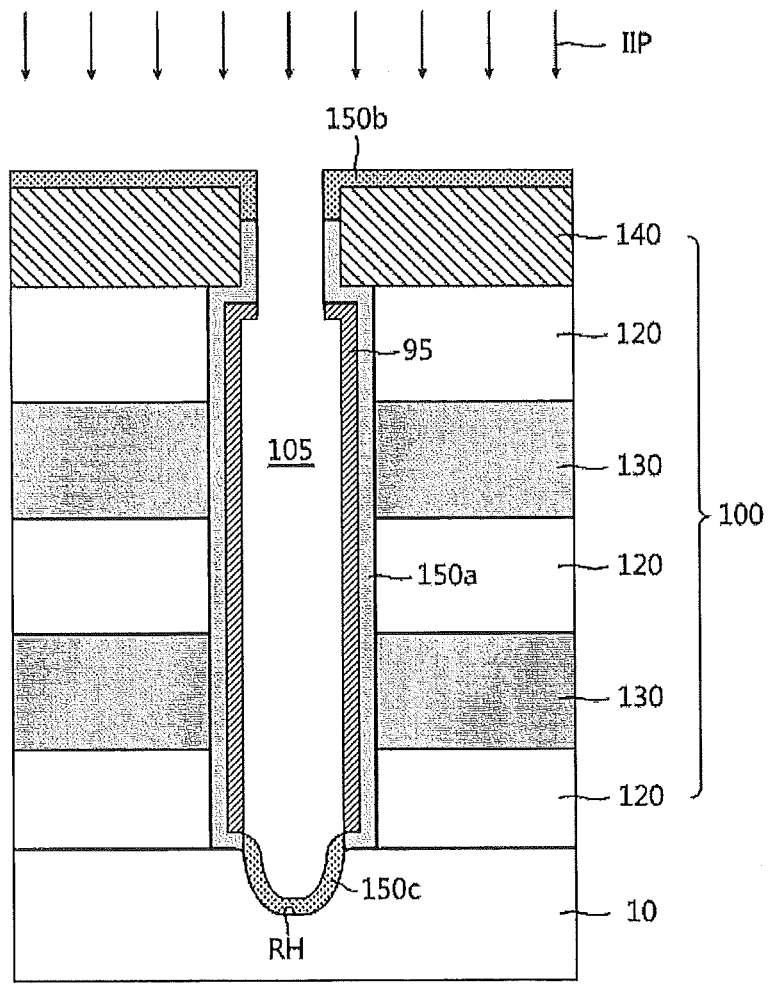

Referring to FIG. 18, the auxiliary mask layer 90 is anisotropically etched to form an auxiliary spacer 95 exposing the insulative protective layer 150 on a bottom surface of an opening 105. A capping mask layer 140 may be used as an etch mask while the auxiliary mask layer 90 is anisotropically etched. Thus, as shown in FIG. 18, the auxiliary spacer 95 may be locally disposed within or around an undercut region UC.

Sequentially, the ion injection process IIP is performed to inject impurities into the exposed insulative protective layer 150. As a result, a second portion 150b on the capping mask layer 140 and a third portion 150c on the bottom surface of the opening 105 are doped with the impurities. Here, the auxiliary spacer 95 may serve as an ion-mask, which prevents the impurities from being injected into a portion of the insulative protective layer 150 formed in the undercut region UC. Thus, a first portion 150a of the undercut region UC is not doped with the impurities. Accordingly, as described with reference to FIG. 12, the insulative protective layer 150 include the second and third portions 150b and 150c in which the impurities are injected and the first portion 150a in which the impurities are not doped.

Figure 19:
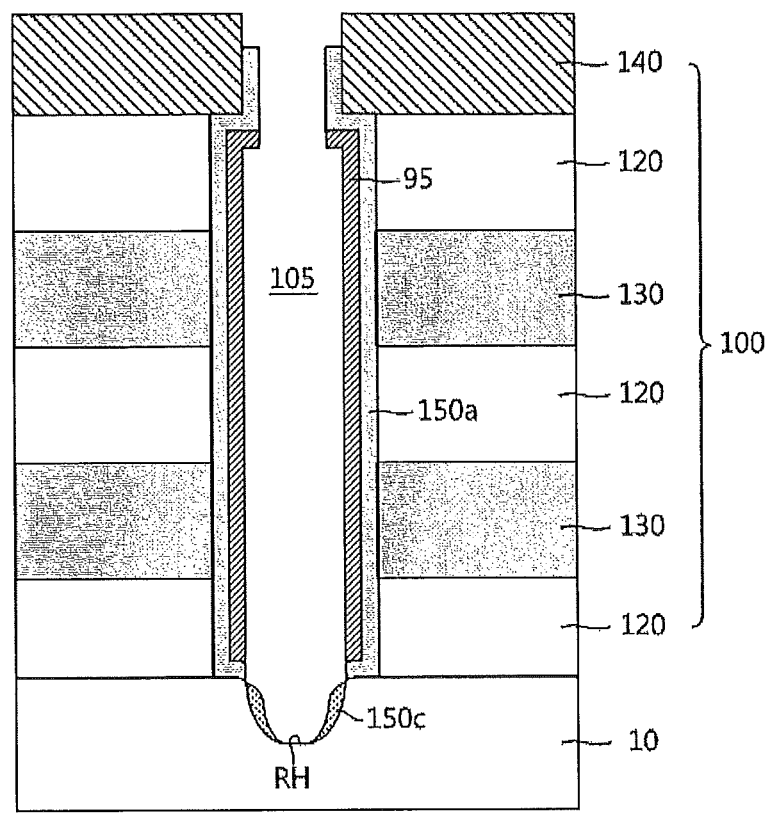
Figure 20:
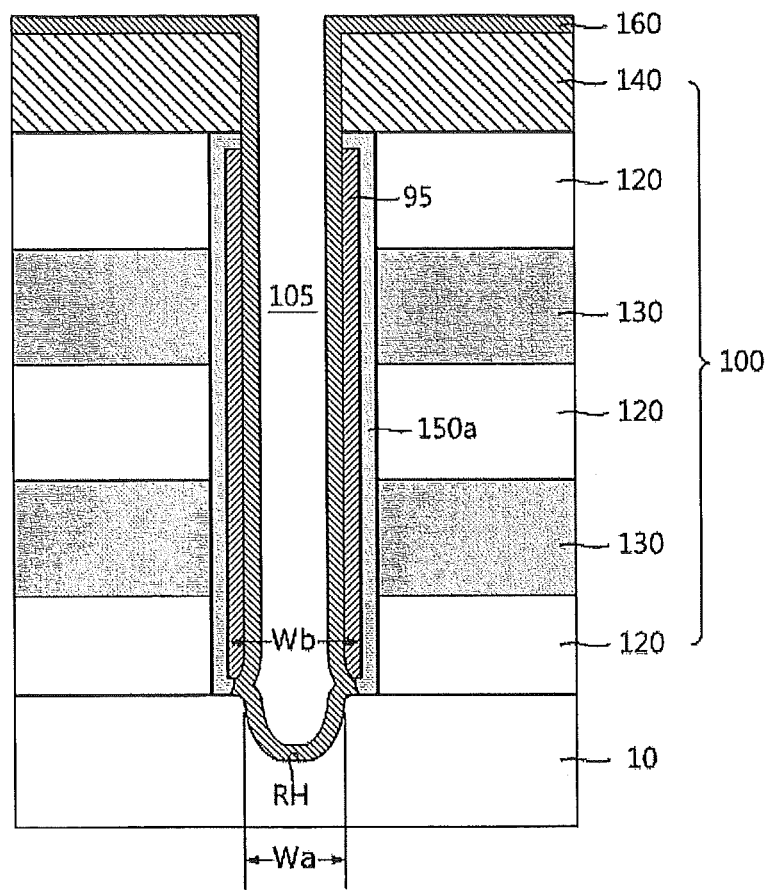

Sequentially, the process of anisotropically etching the insulative protective layer 150 as shown in FIG. 19 and the process of isotropically etching the insulative protective layer 150 as shown in FIG. 20 are sequentially performed to form the semiconductor layer 160 covering an inner wall of a recess hole RH. Since a difference of an impurity concentration may induce a difference of an etch rate as described with reference to FIG. 16, the third portion 150c is selectively removed to expose the entire inner wall of the recess hole RH as described with reference to FIG. 14. As described above, according to modified embodiments, one of the anisotropic and isotropic etch processes may be omitted.

The capping mask layer 140 and the auxiliary spacer 95 may be used as etch masks, which prevent the first portion 150a of the insulative protective layer 150, first layers 120 and second layers 130 from being etched, in the anisotropic and isotropic etch processes. Here, since the auxiliary spacer 95 prevents the first portion 150a of the insulative protective layer 150 from being etched, the third portion 150c may be selectively removed without using the above-mentioned spatial difference in the impurity concentration. Thus, the inventive concept may be realized through other modified embodiments in which the ion injection process IIP is omitted.

Hereinafter, fabrication methods of 3D semiconductor device, which are configured to realize at least one of the above-described various aspects according to the inventive concept, will be exemplarily described with reference to FIGS. 21 to 38. However, the inventive concept is not limited to following embodiments described with reference to FIGS. 21 to 38.

Figure 21:
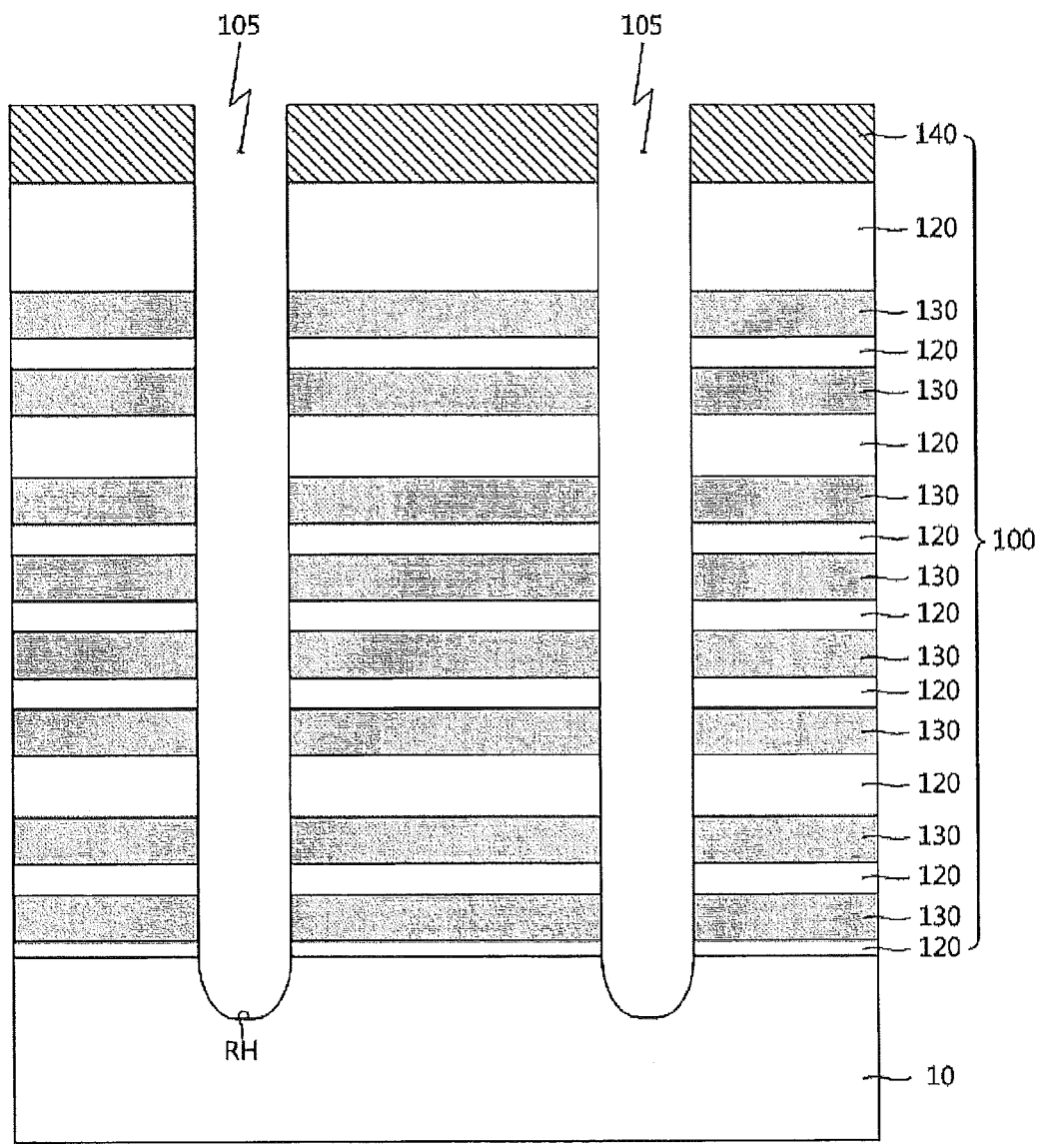
FIGS. 21 to 27 are sectional views for explaining a method of fabricating a three dimensional semiconductor device according to a first embodiment of the inventive concept.

FIGS. 21 to 27 are sectional views illustrating a method of fabricating a 3D semiconductor device, according to a first embodiment configured to realize at least one of the above-described various aspects of the inventive concept. Referring to FIG. 21, a stacked layer structure 100 is formed on a substrate 10, and then, openings 105 passing through the stacked layer structure 100 are formed. The substrate 10 may be formed of one of materials having semiconductor characteristics, insulative materials, and a semiconductor or conductor, which is covered by an insulative material. For example, the substrate 10 may be a silicon wafer. Also, the stacked layer structure 100 may include first layers 120 (or molding layers) and second layers 130 (or sacrificial layers), which are sequentially and alternately formed. In addition, the stacked layer structure 100 may further include a capping mask layer 140 formed on an uppermost portion thereof. The stacked layer structure 100 may be formed using the method described with reference to FIG. 9, except a difference of the number of stacked layers. Hereinafter, for helping to better understand with respect to the inventive concept, some embodiments in which the molding layers 120 are silicon oxide layers and the sacrificial layers are silicon nitride layers will be described as an example.

According to some embodiments, the openings 105 may have a hole shape. That is, each of the openings 105 may have a shape in which a depth thereof is greater at least five times than a width thereof. In addition, according to the present embodiment, the openings 105 may be two-dimensionally formed on a top surface (i.e., an x-y plane) of the substrate 10. That is, each of the openings 105 may be an isolated region spaced from the other opening 105 along X and Y directions.

A process of forming the openings 105 may include a process of forming a predetermined mask pattern, which defines positions of the openings 105 on the stacked layer structure 100 and a process of anisotropically etching the stacked layer structure 100 using the mask pattern as an etch mask. According to some embodiments, the opening 105 may be formed to expose a top surface of the substrate 10. As a result of an over-etching in the anisotropic etch process, the substrate 10 may be recessed to a predetermined depth as shown in FIG. 21. That is, a recess hole RH may be formed in a lower portion of the opening 105.

Figure 22:
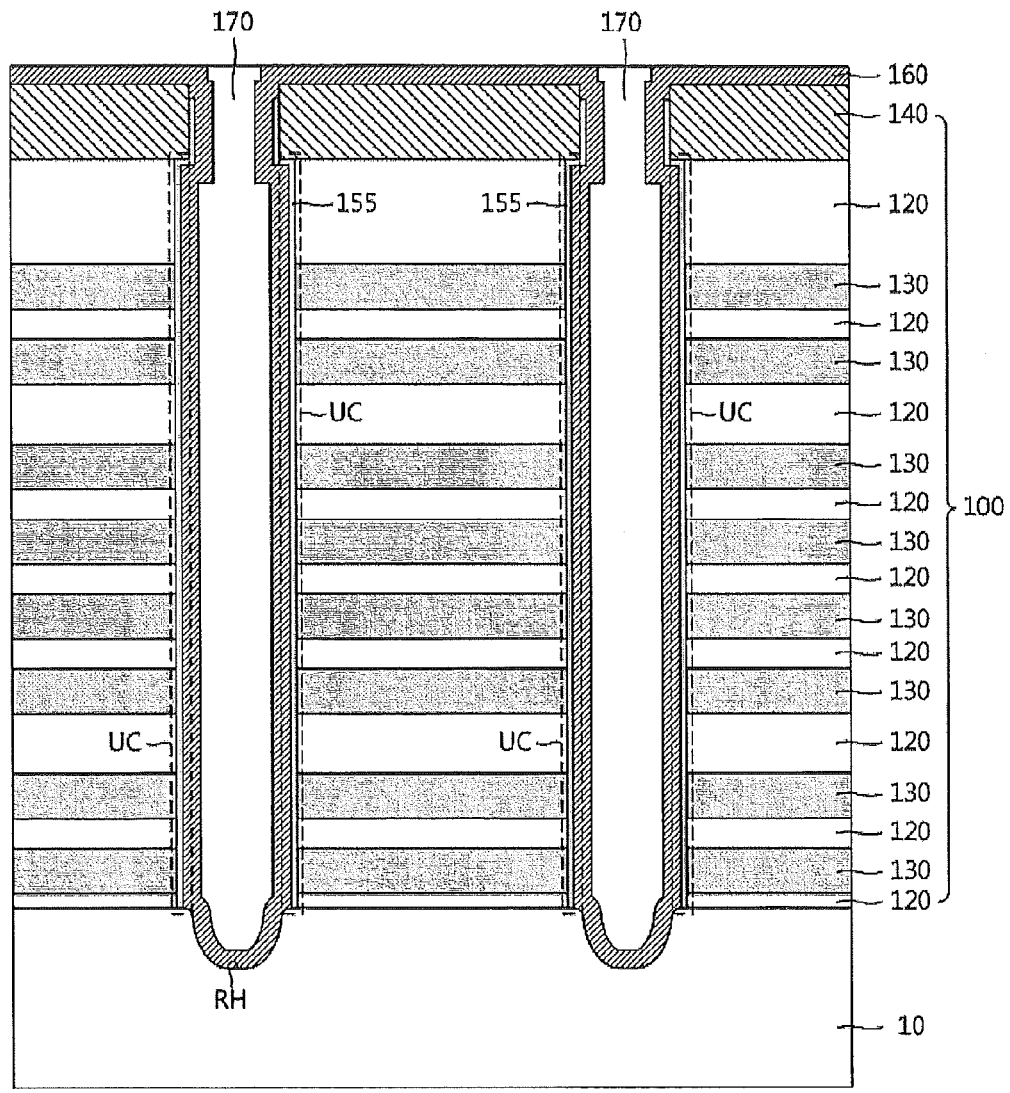

Referring to FIG. 22, sidewalls of the molding layers 120 and the sacrificial layers 130 exposed through the opening 105 are etched to form undercut regions UC that are gap regions formed by horizontally extending from the openings 105. Thereafter, insulation spacers 155, semiconductor layers 160, and gap-fill layers 170, which fill the undercut regions UC and the openings 105, are formed.

The undercut regions UC and the insulation spacers 155 may be formed using the fabrication method described hereinabove. Thus, as shown in FIG. 22, each of the insulation spacers 155 may be substantially locally formed within the undercut region UC. Also, the semiconductor layer 160 may be in direct contact with the entire inner wall of the recess hole RH.

According to some embodiments, the semiconductor layer 160 may be a polysilicon formed using one of CVD or ALD technologies. Also, the semiconductor layer 160 may have a thickness selected within a range of about 1/50 to about 1/5 of the width of the opening 105. According to a modified embodiment, the semiconductor layer 160 may be formed using one of epitaxial technologies. The epitaxial technologies usable for the method of forming the semiconductor layer 160 are disclosed in Korean Application No. 2010-0009628 filed on Feb. 2, 2010, and the contents disclosed herein are to be included in a part of this specification of the inventive concept. According to other modified embodiments of the inventive concept, the semiconductor layer 160 may be one of an organic semiconductor layer and carbon nanostructures.

Figure 23:
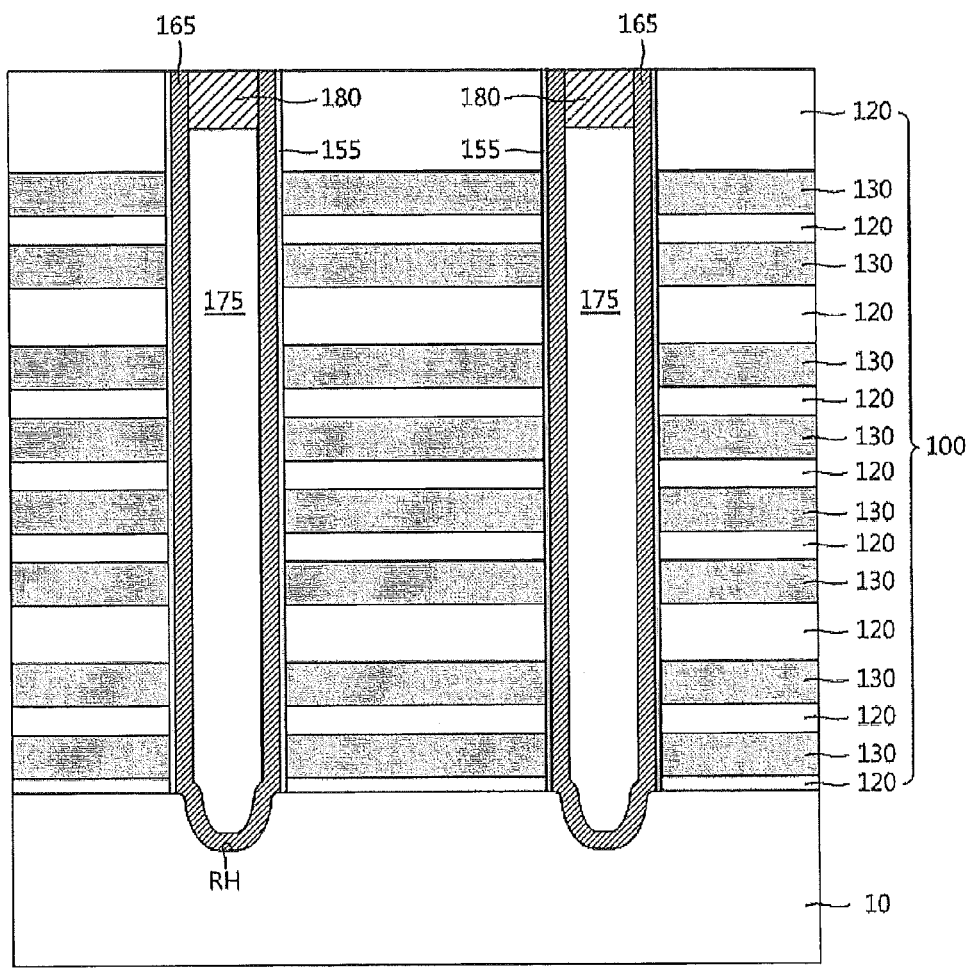

Referring to FIG. 23, the semiconductor layer 160 is planarization-etched to form semiconductor patterns 165 two-dimensionally separated from each other. This process may be performed to expose a top surface of the capping mask layer 140. However, as shown in FIG. 23, the capping mask layer 140 may be removed to expose the molding layer 120. Pad patterns 180 connected to upper regions of the semiconductor patterns 165 may be further formed. The process of forming the pad patterns 180 may include a process of recessing the gap-fill layer 170 to form a gap region at an upper region of the opening 105, a process of forming a pad conductive layer filling the gap region, and a process of planarization-etching the pad conductive layer. The gap-fill layer 170 may be selectively etched to expose an upper sidewall of the semiconductor layer 160 within the opening 105, thereby forming the gap region. Thus, the gap-fill layer 170 forms a locally gap-fill pattern 175 within the opening 105.

The pad conductive layer may be formed of a semiconductor material having a conductive type different from that of the semiconductor layer 160. For example, the pad conductive layer may be an n-type polysilicon layer formed using a deposition technology. According to modified embodiments, a process of injecting impurities into the semiconductor layer 160 or the pad conductive layer may be further performed after the pad conductive layer is formed. The process of planarization-etching the pad conductive layer may be simultaneously performed with a process of planarization-etching the semiconductor layer 160.

Figure 24:
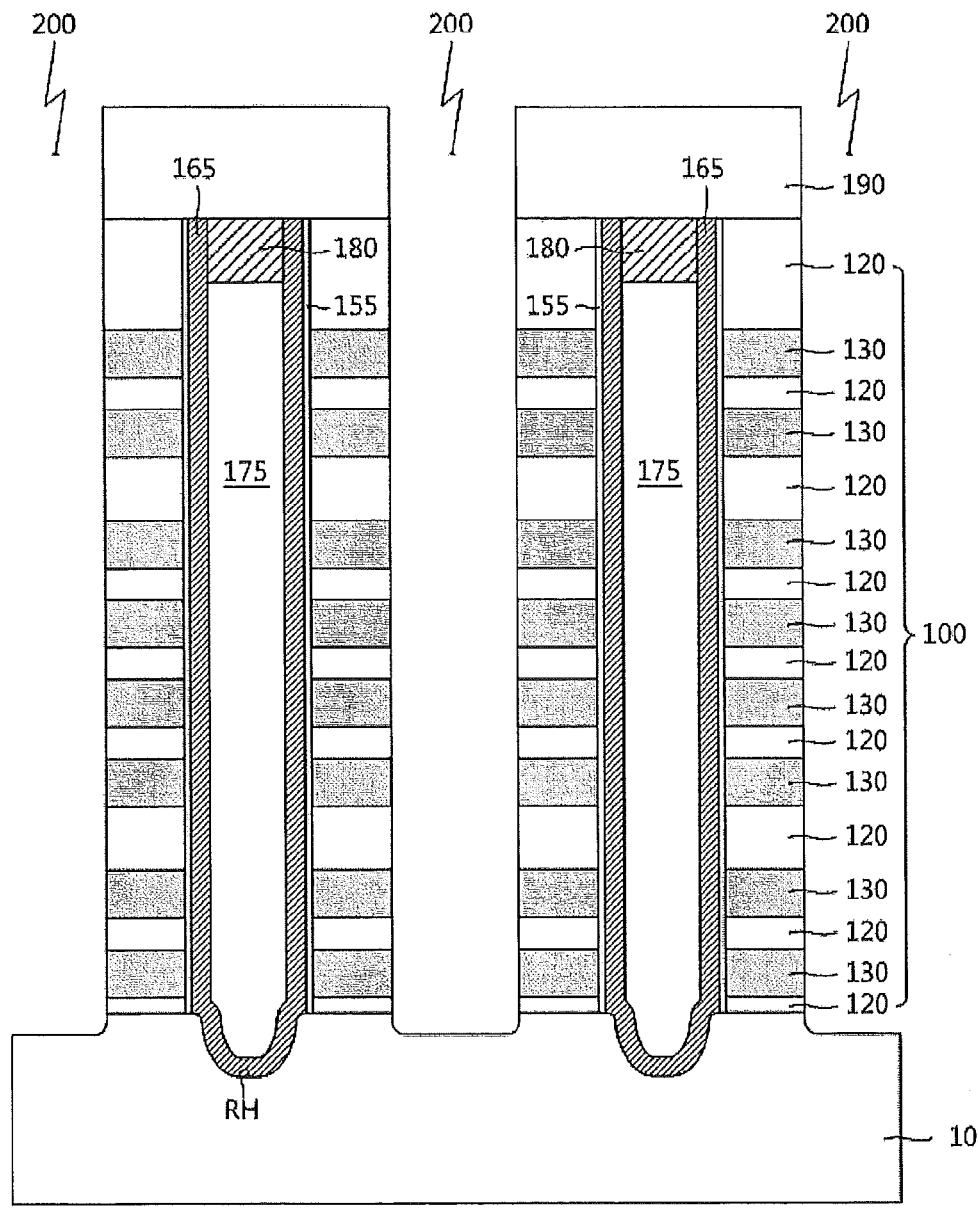

Referring to FIG. 24, trenches 200 passing through the stacked layer structure 100 and exposing the sidewalls of the sacrificial layers 130 and the molding layers 120 are formed. The trenches 200 may be spaced from the openings 105 to cross between the openings 105. The process of forming the trenches 200 may include forming an upper insulation layer 190 on the stacked layer structure 100 and etching anisotropically the layers constituting the stacked layer structure 100 using the upper insulation layer 190 as an etch mask. Here, the trenches 200 may expose the top surface of the substrate 10. Also, as a result of an over-etching in the anisotropic etch process, the substrate 10 disposed below the trenches 200 may be recessed to a predetermined depth as shown in FIG. 24.

According to some embodiments, as shown in FIG. 24, the pair of trenches 200 may be formed on both sides of each of the openings 105. That is, the number of the openings 105 arranged in a direction crossing the trenches 200 may be substantially equal to that of the trenches 200. However, the inventive concept is not limited to the embodiments. For example, the plurality of two-dimensionally arranged semiconductor patterns 165 may be disposed between the pair of trenches 200 adjacent to each other. That is, at least two of the semiconductor patterns 165 (disposed between the pair of the trenches 200 adjacent to each other) may have different distances from the trenches 200.

Figure 25:
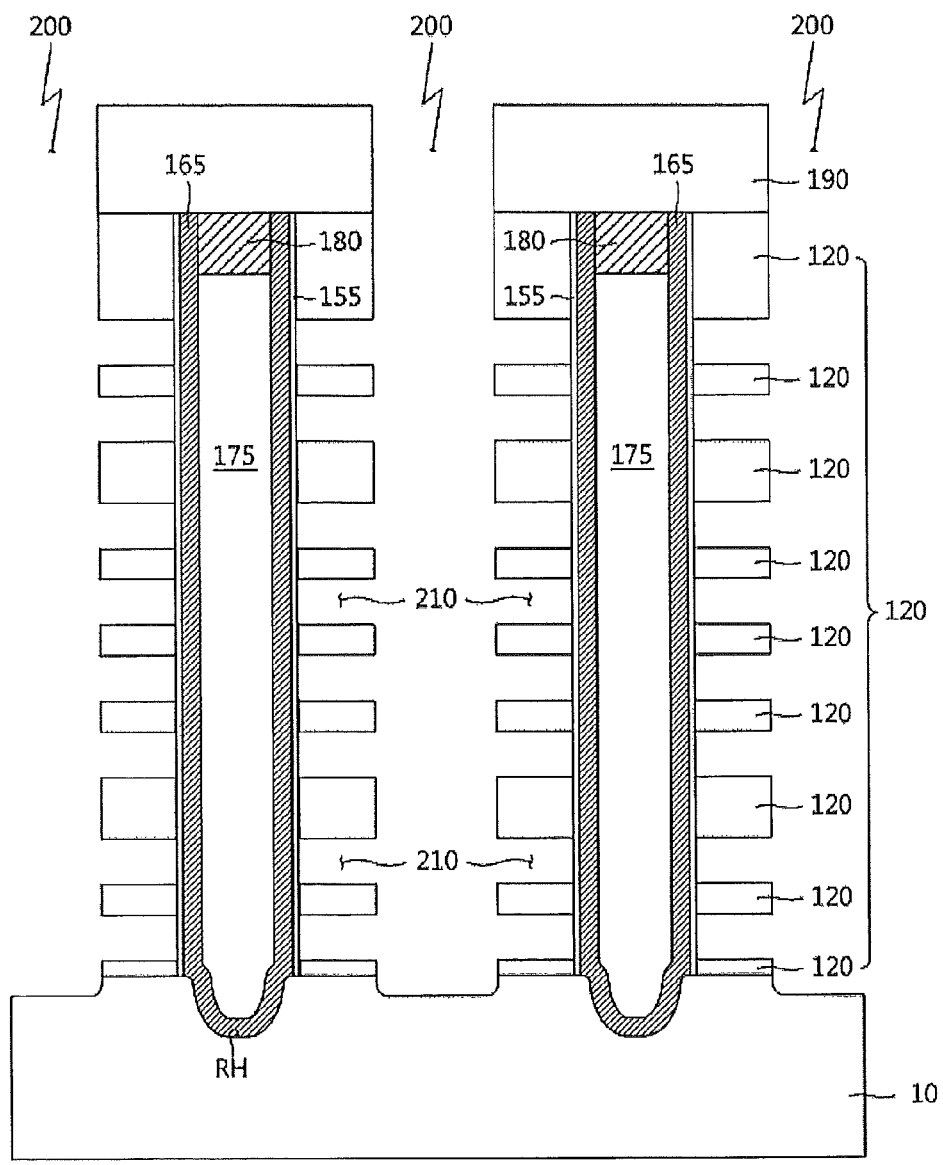

Referring to FIG. 25, the exposed sacrificial layers 130 are selectively removed to form recess regions 210 between the molding layers 120. The recess regions 210 may be gap regions horizontally extending from the trenches 200. Also, the recess regions 210 may expose the sidewalls of the insulation spacers 155. Furthermore, an outer boundary of each of the recess regions 210 is defined by the molding layers disposed on upper and lower portions of the recess region 210 and the trenches 200 disposed on both sides of the recess region 210. Also, an internal boundary of the recess region 210 is defined by the insulation spacers 155 vertically passing through the recess region 210.

The process of forming the recess regions 210 may include a process of horizontally etching the sacrificial layers 130 using an etch recipe having an etch selectivity relative to the molding layers 120 and the insulation spacers 155. For example, when the sacrificial layers 130 are silicon nitride layers and the molding layers 120 are silicon oxide layers, the process of horizontally etching the sacrificial layers 130 may be performed using an etchant containing phosphoric acid. According to the present embodiment, as described with reference to FIGS. 2 to 4, the insulation spacers 155 may serve as protective layers or etch stop layers, which prevent the semiconductor patterns 165 from being recessed in the process of forming the recess regions 210.

Figure 26:
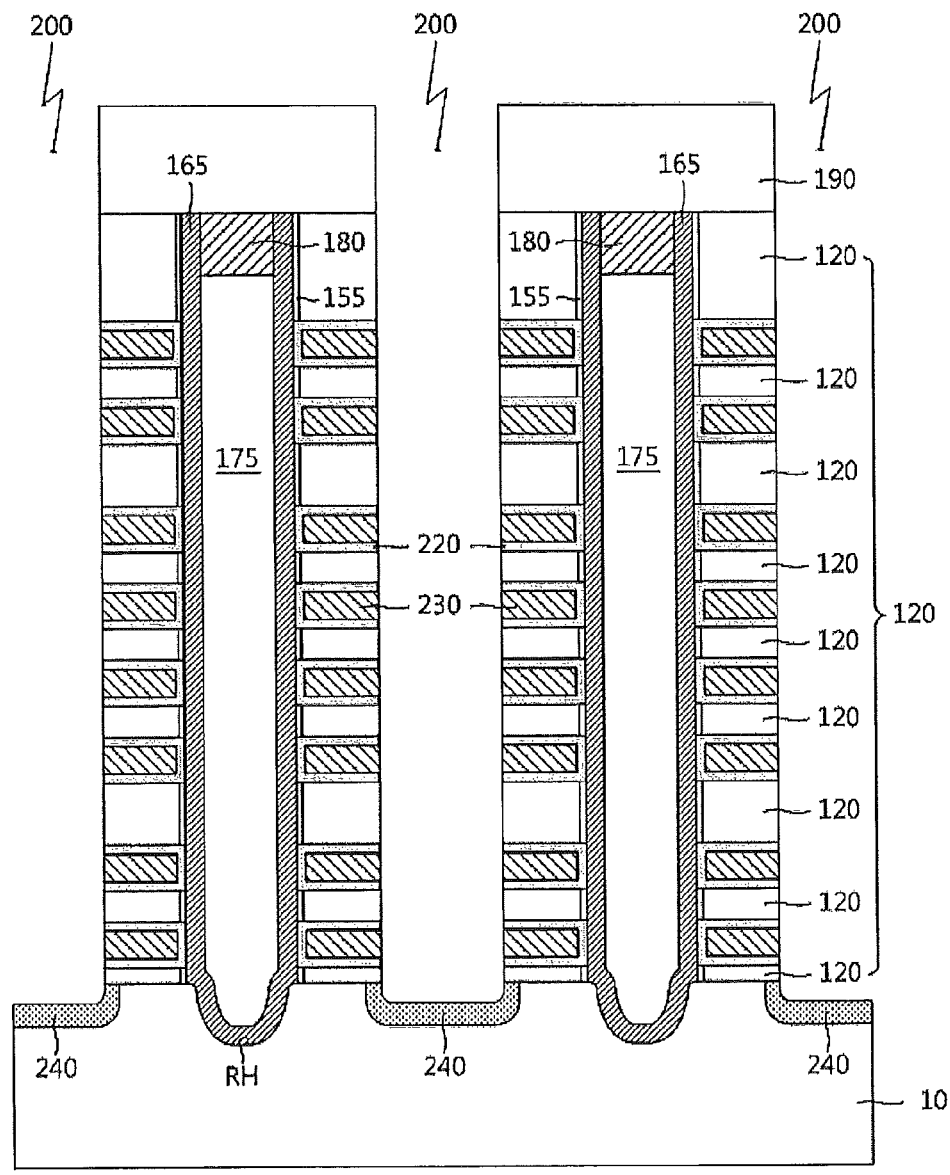

Referring to FIG. 26, horizontal structures filling the recess regions 210 are formed. Each of the horizontal structures may include an information storage layer 220 covering an inner wall of the recess region 210 and a conductive pattern filling a remaining space of the recess region 210.

According to the present embodiment, a process in which the exposed sidewall of the insulating spacer 155 may be etched to expose the sidewall of the semiconductor pattern 165 may be performed before the horizontal structures are formed. This process may be performed using the method described with reference to FIGS. 3 and 4. Thus, the insulating spacer 155 may be vertically separated to locally dispose the separated insulation spacers 155 between the molding layers 120 and the semiconductor patterns 165 in vertical positions of the insulation spacers 155. The vertically separated insulation spacers 155 may be a pattern having a ring shape.

The process of forming the horizontal structures may include forming sequentially an information storage layer 220 and a conductive layer filling the recess regions 210, and thereafter, removing the conductive layer within the trenches 200 to form the conductive patterns 230 remaining within the recess regions 210. As shown in FIG. 26, the information storage layer 220 may be in direct contact with the sidewall of the semiconductor pattern 165 exposed by etching the insulating spacer 155.

The information storage layer 220 may include one thin film or a plurality of thin films. The conductive layer may fill the recess regions 210 covered by the information storage layer 220. Here, the trenches 200 may be completely or partially filled with the conductive layer. The conductive layer may be formed of at least one of doped silicon, metal materials, metal nitride layers and metal silicides. For example, the conductive layer may include a tantalum nitride layer or tungsten. According to some embodiments, the conductive layer may conformally cover the inner wall of the trench 200. In this case, the process of forming the conductive pattern 230 may include a process of removing the conductive layer within the trench 200 through the isotropic etch process. According to other embodiments, the conductive layer may fill the trench 200. In this case, the process of forming the conductive pattern 230 may include a process of anisotropically etching the conductive layer within the trench 200.

According to some embodiments of the inventive concept for a FLASH memory, a process of forming impurity regions 240 may be further performed after the conductive patterns 230 are formed. The impurity regions 240 may be formed through an ion injection process. Also, the impurity regions 240 may be formed within the substrate 10 exposed through the trenches 200. The impurity regions 240 may have a conductive type different from that of the substrate 10.

Figure 27:
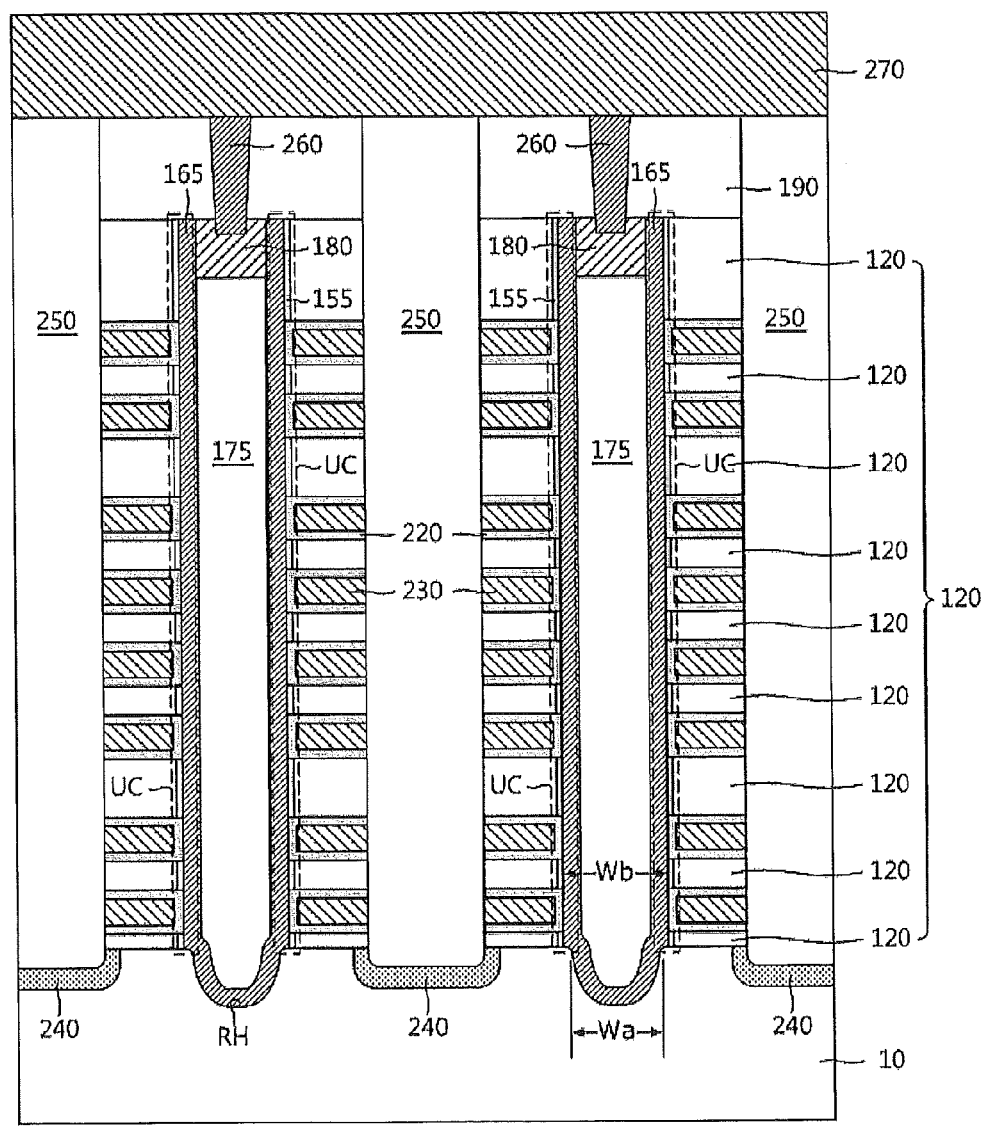

Referring to FIG. 27, electrode separation patterns 250 filling the trenches 200 are formed, and then, upper plugs 260 respectively connected to the pad patterns 180 and upper wires 270 connecting the upper plugs 260 to each other are sequentially formed. Each of the upper wires 270 may be electrically connected to the semiconductor pattern 165 through the upper plug 260, and also may cross the conductive patterns 230. According to some embodiments for a NAND FLASH memory, the upper wires 270 may be used as bit lines connected to one ends of a plurality cell strings.

Figure 28:
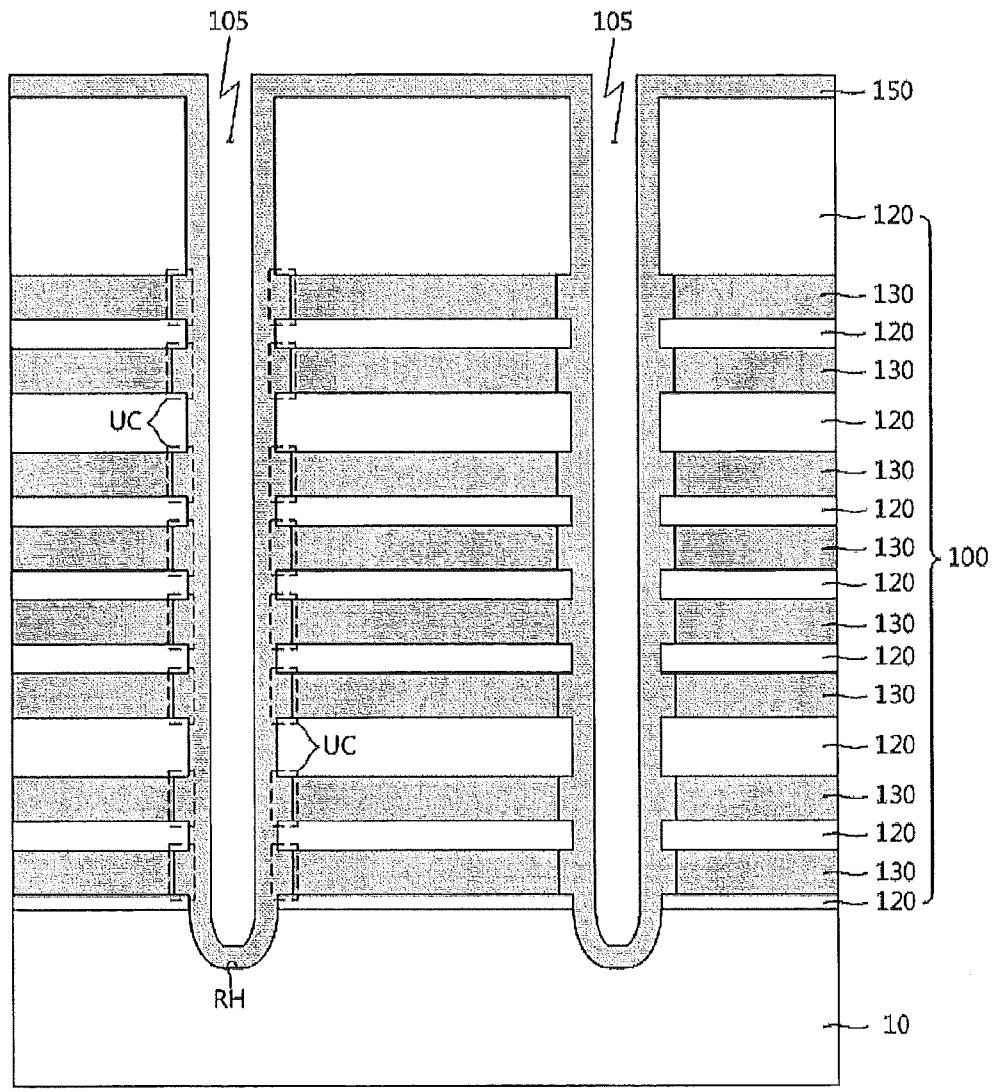
FIGS. 28 to 32 are sectional views for explaining a method of fabricating a three dimensional semiconductor device according to a second embodiment of the inventive concept.

FIGS. 28 to 32 are sectional views illustrating a method of fabricating a 3D semiconductor device, according to a second embodiment configured to realize at least one of the above-described various aspects of the inventive concept. To avoid unnecessary duplication of description, technical features previously described with the above-described fabrication methods may be omitted. Referring to FIG. 28, a stacked layer structure 100 is formed on a substrate 10. An opening 105 passing through the stacked layer structure 100 is formed, and then a protective layer 150 is conformally formed to cover an inner wall of the opening 105. According to the present embodiment, sidewalls of sacrificial layers 130 exposed by the opening 105 may be recessed to form undercut regions UC between molding layers 120 before the protective layer is formed. In this case, the plurality of undercut regions UC having heights different from each other may be formed around one opening 105. The protective layer 150 may fill the undercut regions UC. That is, the protective layer 150 may have a thickness thicker than a half of a thickness of each of the undercut regions UC and thinner than a half of a width of the opening 105. Meanwhile, according to a modified embodiment, as shown in FIG. 28, the stacked structure 100 may not include a capping mask layer 140, unlike the foregoing embodiments. That is, the stacked layer structure according to the present embodiment may be constituted by the sacrificial layers 130 and the molding layers 120.

Figure 29:
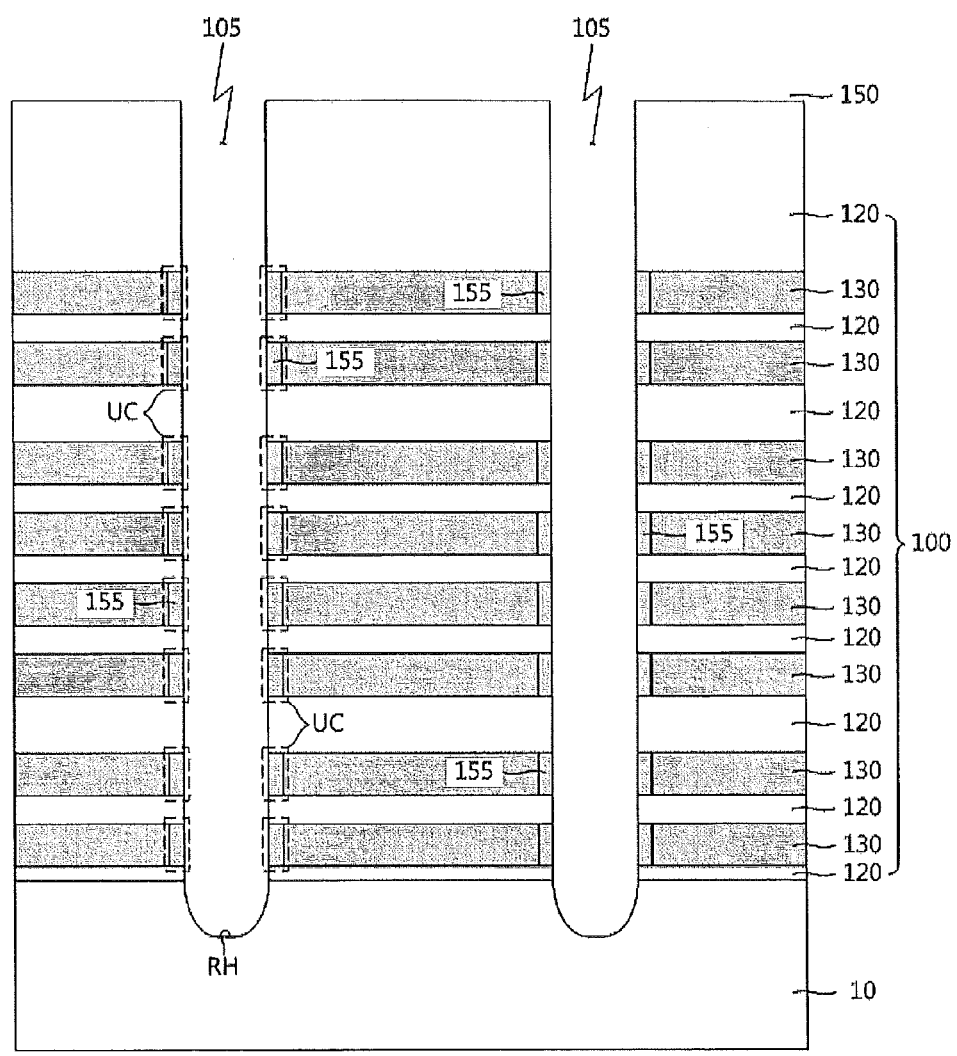

Referring to FIG. 29, the protective layer 150 is patterned to form protective spacers 155 remaining in the undercut regions UC. The process of forming the protective spacers 155 may be performed using the fabrication method described with reference to FIGS. 10 to 14. Alternatively, the protective spacers 155 may be locally disposed in the undercut regions UC through a process of isotropically etching the protective layer 150. Like the foregoing embodiments, the protective layer 150 may be completely removed within a recess hole RH to expose the entire inner wall of the recess hole RH.

Figure 30:
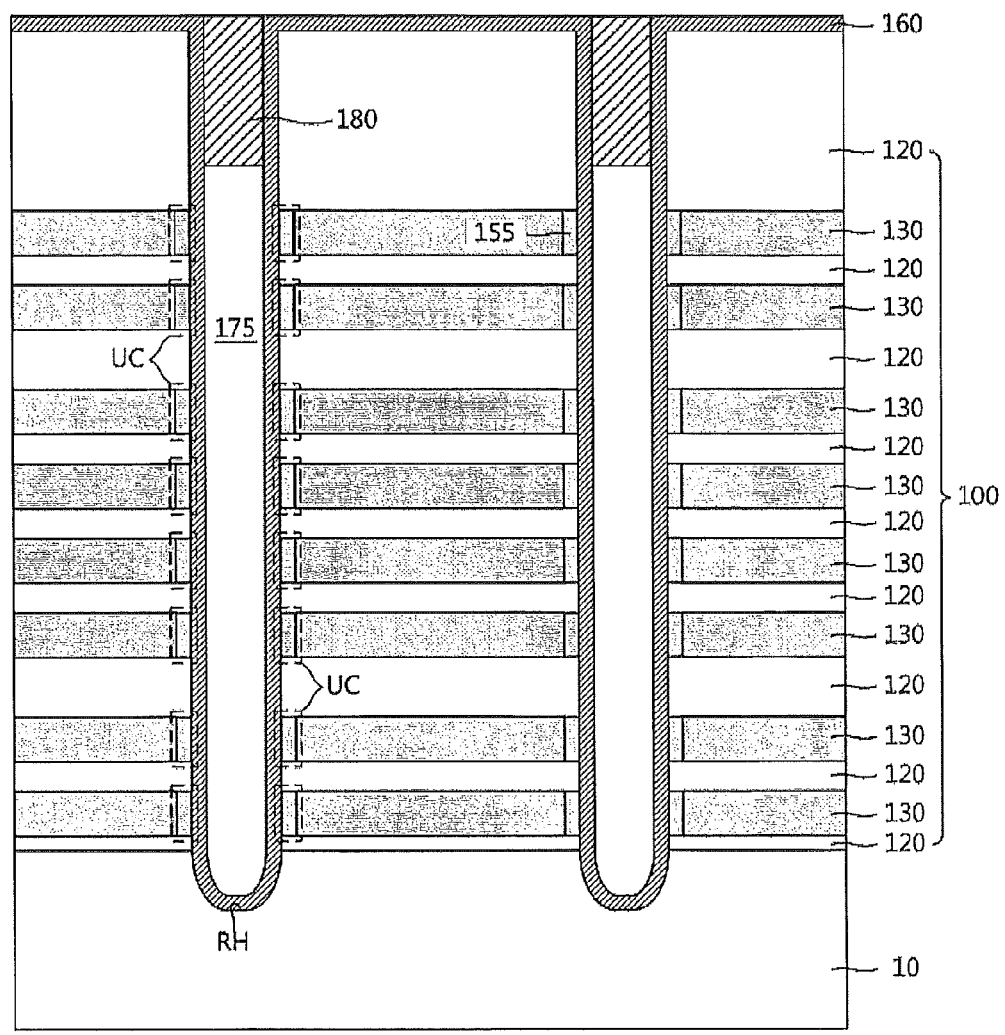

Referring to FIG. 30, a semiconductor layer 160 covering the inner wall of the opening 105 is formed, and then, gap-fill patterns 175 and pad patterns 180, which fill a remaining space of the opening 105, are formed. This process may be performed using the fabrication method described with reference to FIGS. 22 and 23.

Figure 31:
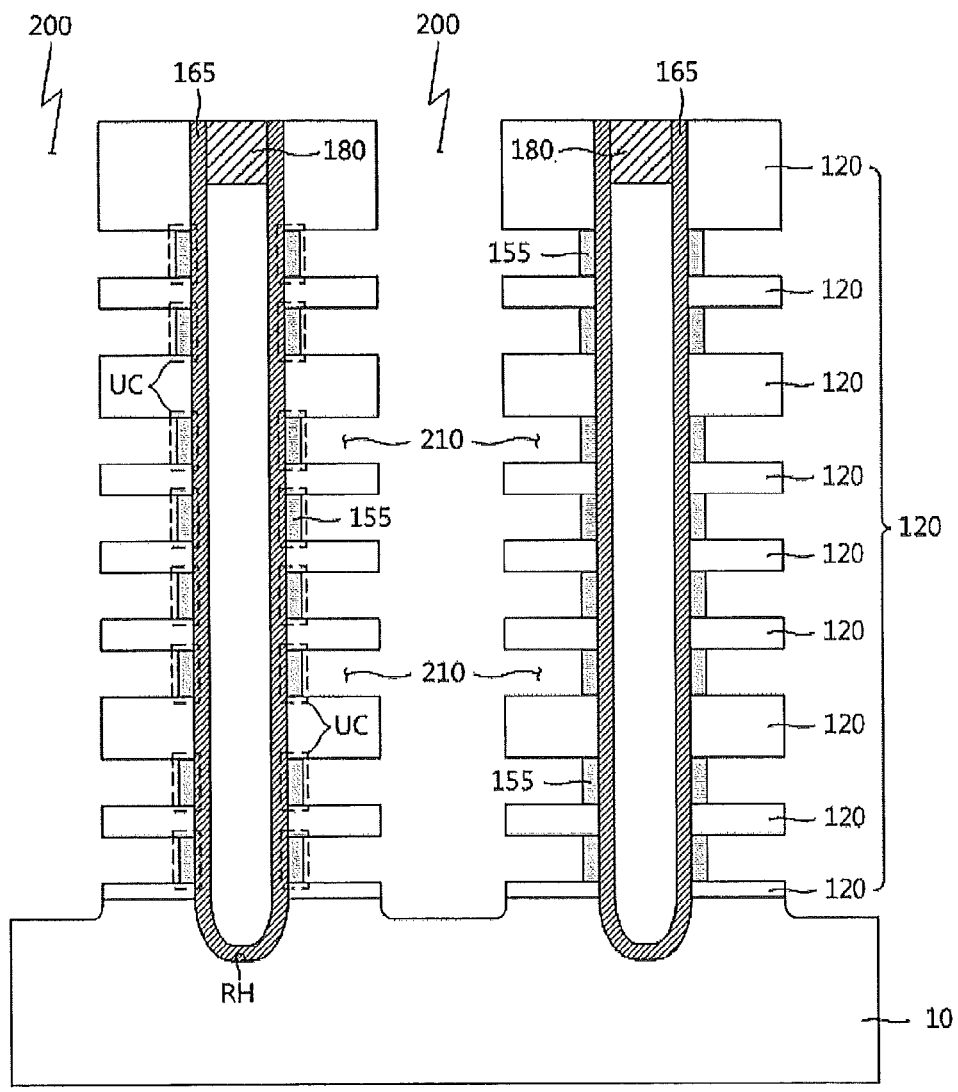

Referring to FIG. 31, the semiconductor layer 160 is patterned to form semiconductor patterns 165 localized within the openings 105. Thereafter, trenches 200 passing through the stacked layer structure 100 are formed. Sequentially, the sacrificial layers 130 are selectively removed to form recess regions 210 exposing the protective spacers 155. This process may be performed using the fabrication method described with reference to FIGS. 24 and 25.

Figure 32:
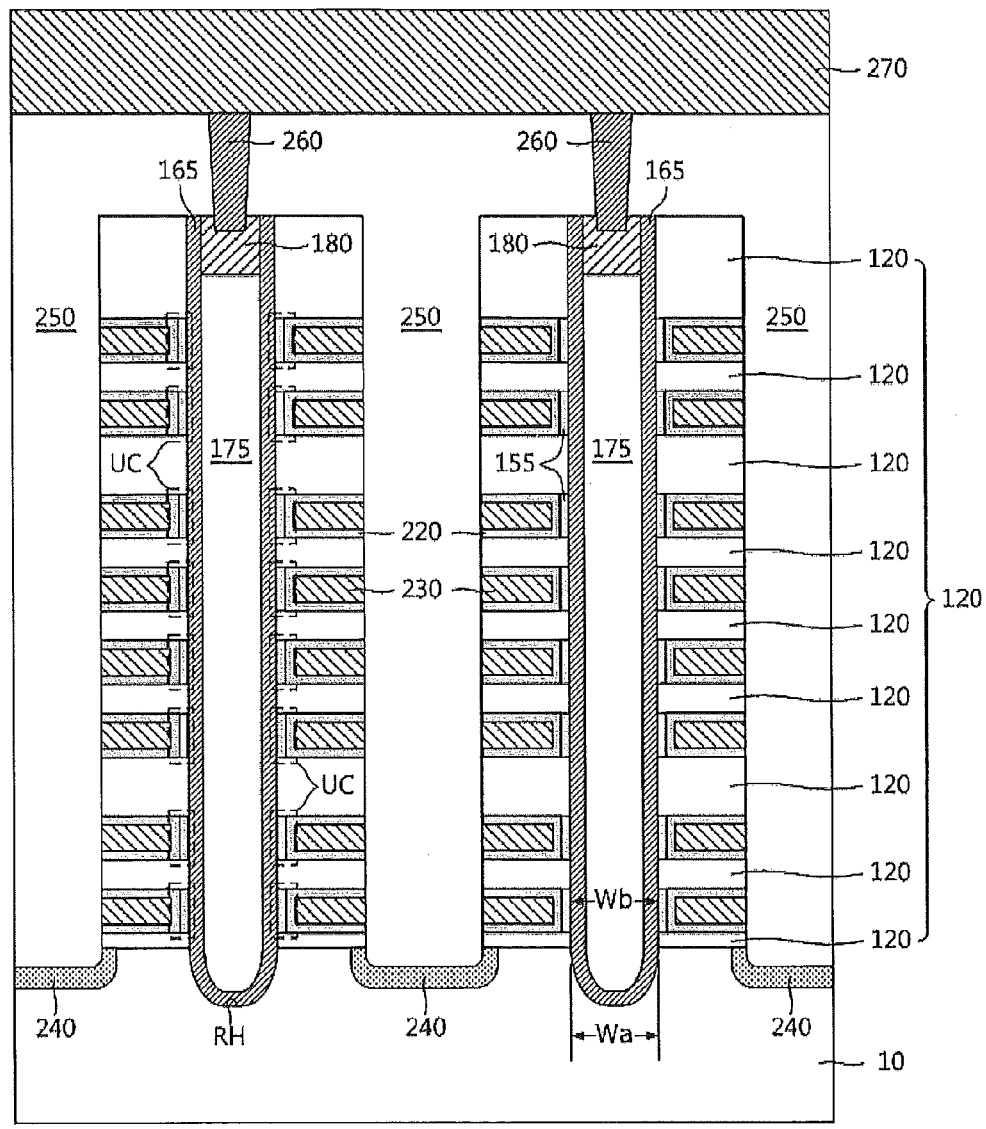

Referring to FIG. 32, an information storage layer 220 and a conductive pattern 230 are formed in the recess region 210. Here, the information storage layer 220 may cover the inner wall of the recess region 210 and the conductive pattern 230 may fill a remaining space of the recess region 210. Then, electrode separation patterns 250 filling the trenches 200, upper plugs 260 respectively connected to the pad patterns 180, and upper wires 270 connecting the upper plugs 260 to each other are sequentially formed. A process of forming impurity regions 240 may be further performed before the electrode separation patterns 250 are formed. This process may be performed using the fabrication method described with reference to FIGS. 26 and 27.

According to some embodiment, a process of removing the protective spacers 155 may be omitted. In this case, as shown in FIG. 32, the protective spacers 155 may be disposed between the information storage layer 220 and the semiconductor pattern 165. However, according to other embodiments, as described with reference to FIG. 26, the information storage layer 220 may be formed to be in direct contact with a sidewall of the semiconductor pattern 165 after the protective spacers 155 are removed.

Since the undercut regions UC are locally formed on sidewalls of the sacrificial layers 130, the protective spacers 155 are not formed between the molding layers 120 and the semiconductor patterns 165 as shown in FIG. 32, Thus, in these embodiments, it is not necessary to limit the protective spacer 155 to an insulation material like the foregoing embodiments. That is, according to the present embodiment, the protective spacer 155 may be formed of at least one of an insulative material, a conductive material, and a semiconductor material. For example, as shown in FIG. 32, when the protective spacer 155 is disposed between the information storage layer 220 and the semiconductor pattern 165, the protective spacer 155 may be formed of a semiconductor material like as the semiconductor pattern 165 or a material constituting the information storage layer 220.

FIGS. 33 to 36 are sectional views illustrating a method of fabricating a 3D semiconductor device, according to a third embodiment configured to realize at least one of the above-described various aspects of the inventive concept.

Figure 33:
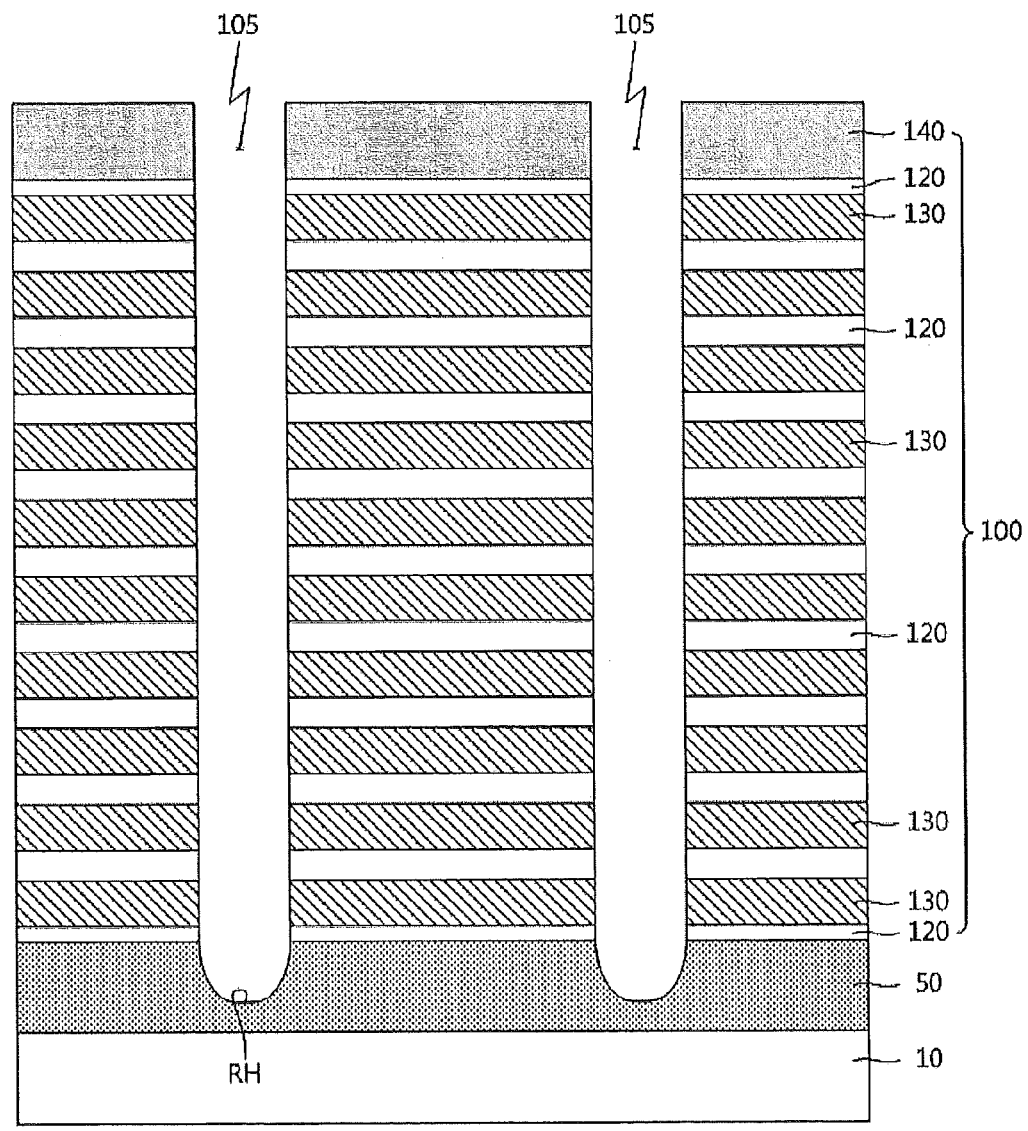
FIGS. 33 to 36 are sectional views for explaining a method of fabricating a three dimensional semiconductor device according to a third embodiment of the inventive concept.

Referring to FIG. 33, a lower conductive region 50 is formed on a substrate 10. Then, a stacked layer structure 100 is formed on the lower conductive region 50. Sequentially, openings 105 passing through the stacked layer structure 100 to define a recess hole RH in the lower conductive region 50 are formed. According to some embodiments, the lower conductive region 50 may be an impurity region formed by injecting impurities into the substrate 10. In this case, the lower conductive region 50 may have a conductive type different from that of the substrate 10.

According to the present embodiment, the stacked layer structure 100 includes first layers 120 and second layers 130, which are sequentially and alternately formed. The first layers 120 may be formed of an insulative material (e.g., silicon oxide), and the second layers 130 may be formed of a conductive material (e.g., doped polysilicon). In addition, the stacked layer structure 100 may further include a capping mask layer 140 formed on an uppermost portion thereof. The capping mask layer 140 may be formed of a material different from those of the first and second layers 120 and 130. For example, the capping mask layer 140 may be formed of a material, which is selected from silicon oxide, silicon nitride, silicon oxynitride, silicon germanium, silicon, and carbide, but different from those of the first and second layers 120 and 130.

Figure 34:
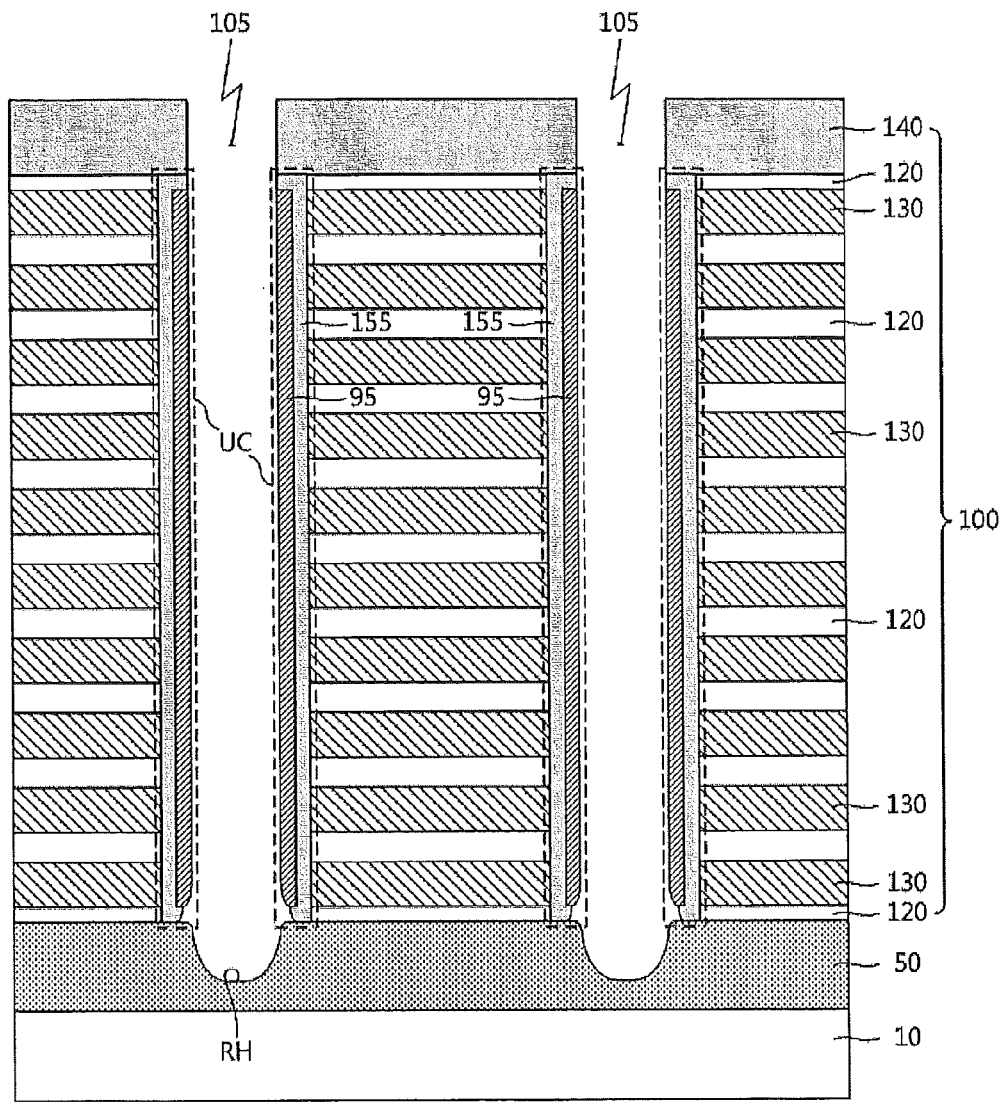
Figure 35:
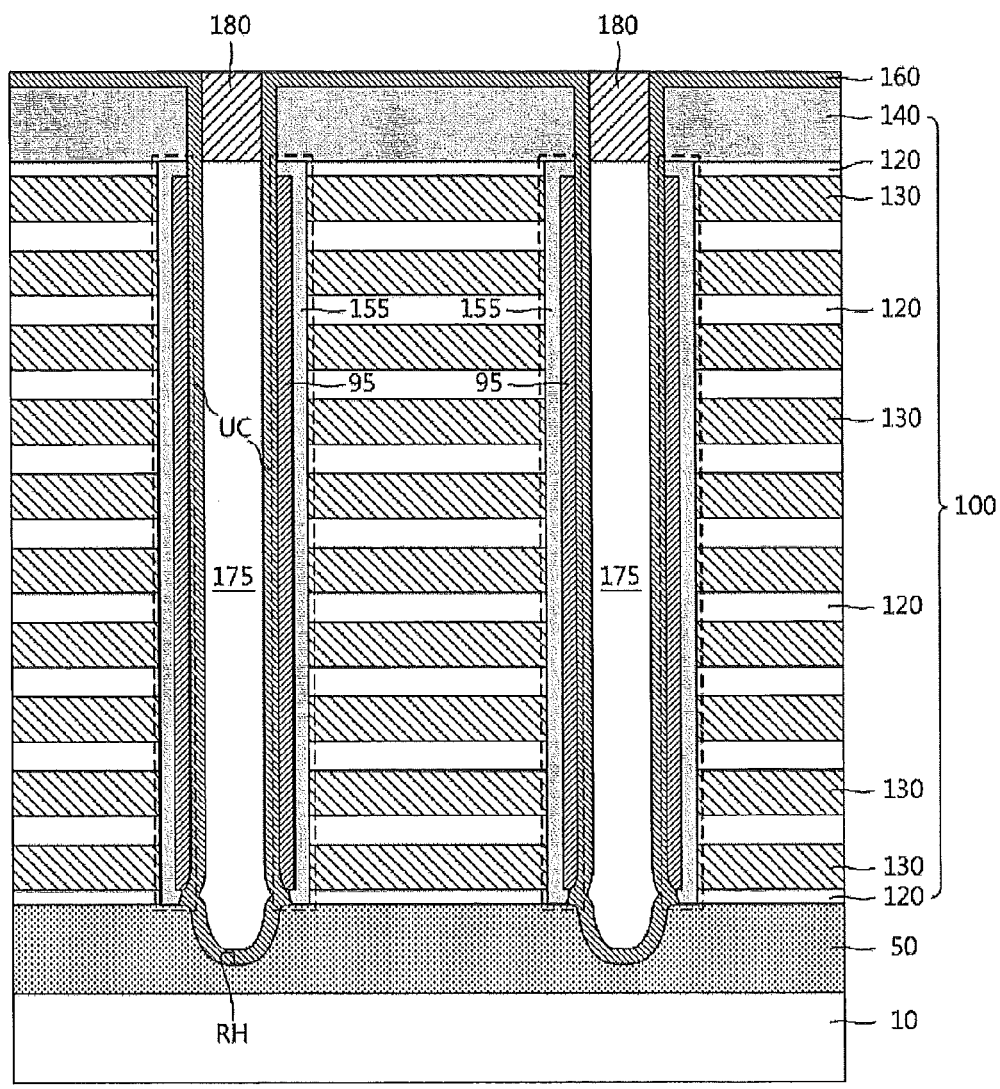

Referring to FIG. 34, sidewalls of the first and second layers 120 and 130 exposed through the opening 105 are etched to form an undercut region UC that is a gap region horizontally extending from the opening 105. Thereafter, an insulating spacer 155 and an auxiliary spacer 95 are formed in the undercut region UC. This process may be performed using the fabrication method described with reference to FIGS. 17 to 20. Thus, the insulating spacer 155 and the auxiliary spacer 95 are locally disposed within the undercut region UC to expose the entire inner wall of the recess hole RH. Referring to FIG. 35, a semiconductor layer 160 covering inner walls of the recess hole RH and the auxiliary spacer 95 is formed. Then, gap-fill patterns 175 and pad patterns 180 filling a remaining space of the opening 105 are formed.

Figure 36:
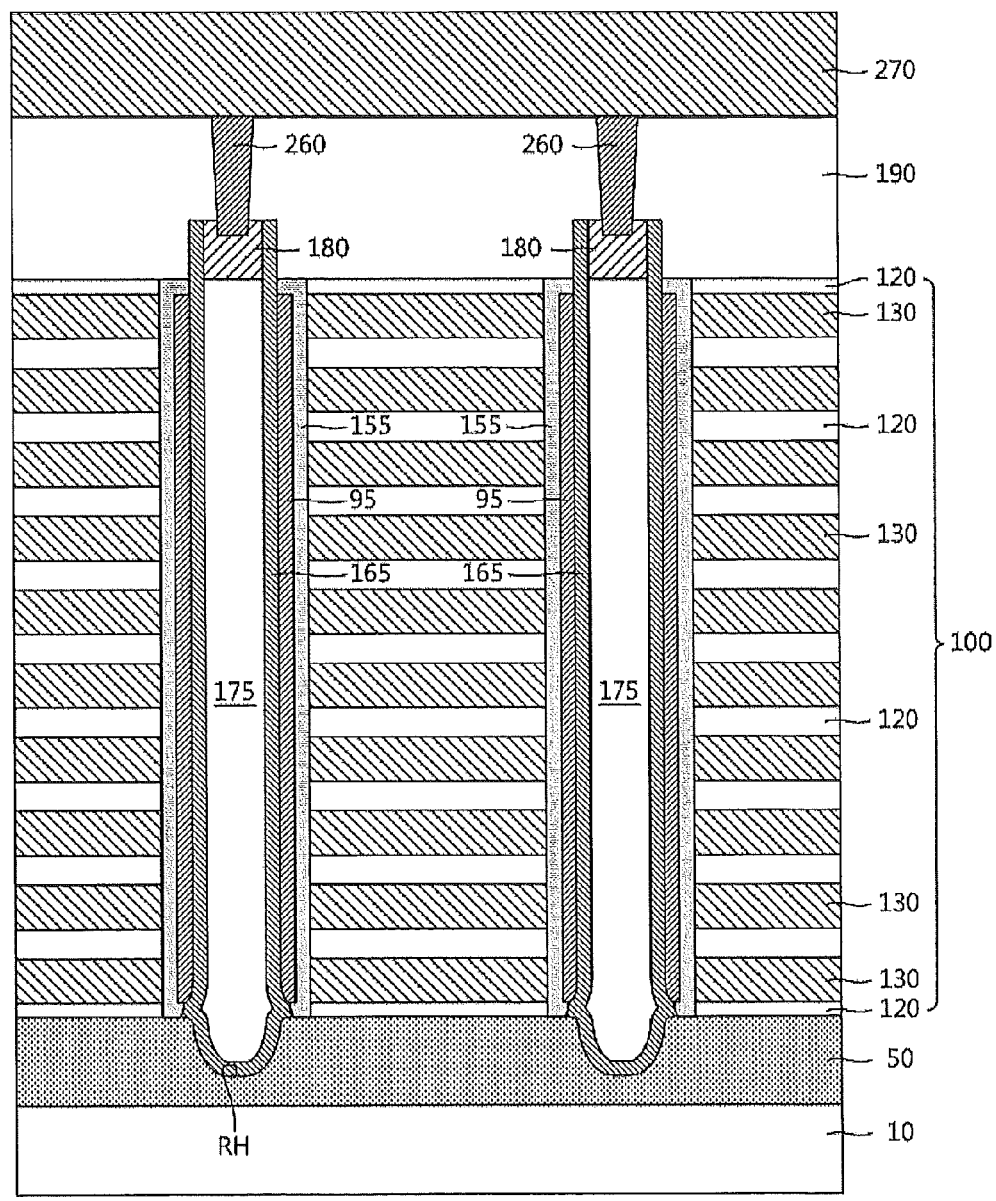

Referring to FIG. 36, the semiconductor layer 160 is patterned to form local semiconductor patterns 165 within the openings 105. Thereafter, upper plugs 260 respectively connected to the pad patterns 180 and upper wires 270 connecting the upper plugs 260 to each other are sequentially formed. This process may be performed using the fabrication method described with reference to FIG. 32.

A process of forming an upper insulation layer 190 may be further performed after the capping mask layer 140 is removed. The capping mask layer 140 may be selectively removed using an etch recipe having an etch selectivity relative to the semiconductor patterns 165 and the pad patterns 180. The upper plugs 260 may pass through the upper insulation layer 190 and may be connected to the pad patterns 180.

Referring to FIG. 36, the insulating spacer 155 is disposed between the auxiliary spacer 95 and the second layers 130. When an element for storing data is a part of memory semiconductor devices formed between the auxiliary spacer 155 and the second layers 130, the insulating spacer 155 may be used as an element for storing information. For example, the insulating spacer 155 may have a multi-layered thin film structure for storing a charge.

Figure 37:
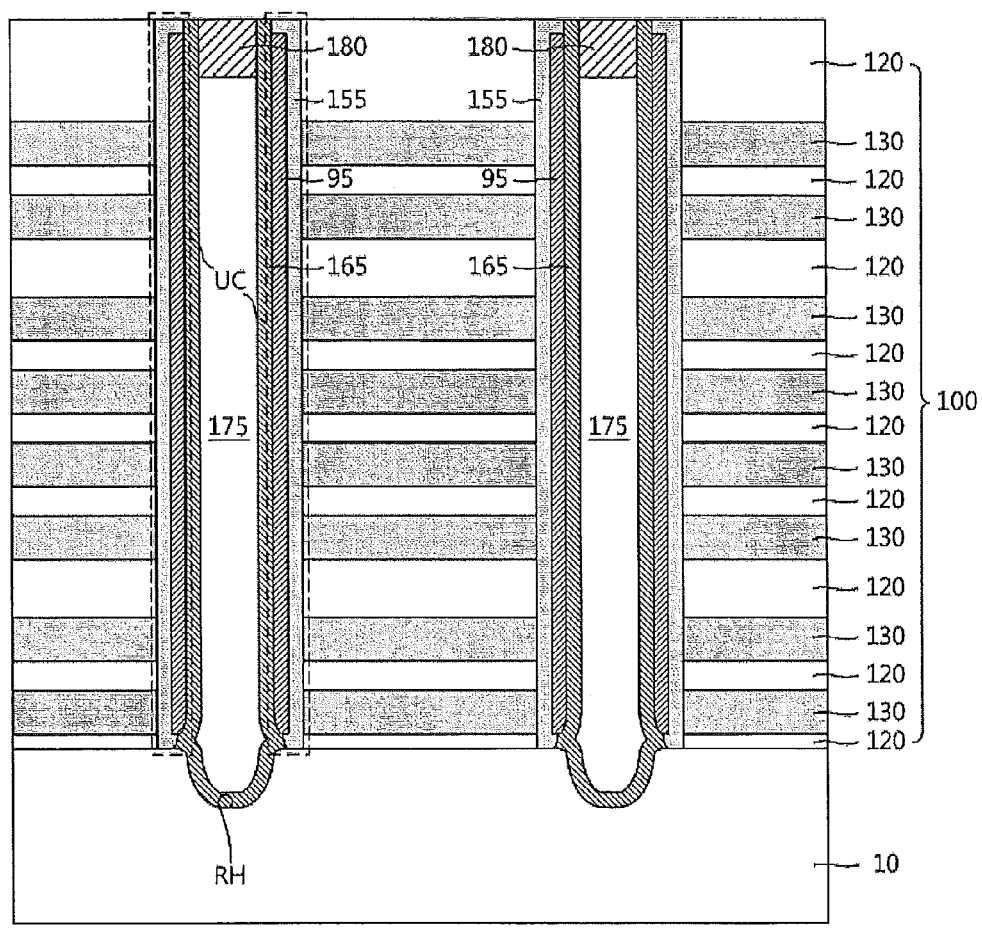
FIGS. 37 to 39 are sectional views for explaining a method of fabricating a three dimensional semiconductor device according to a fourth embodiment of the inventive concept.
Figure 38:
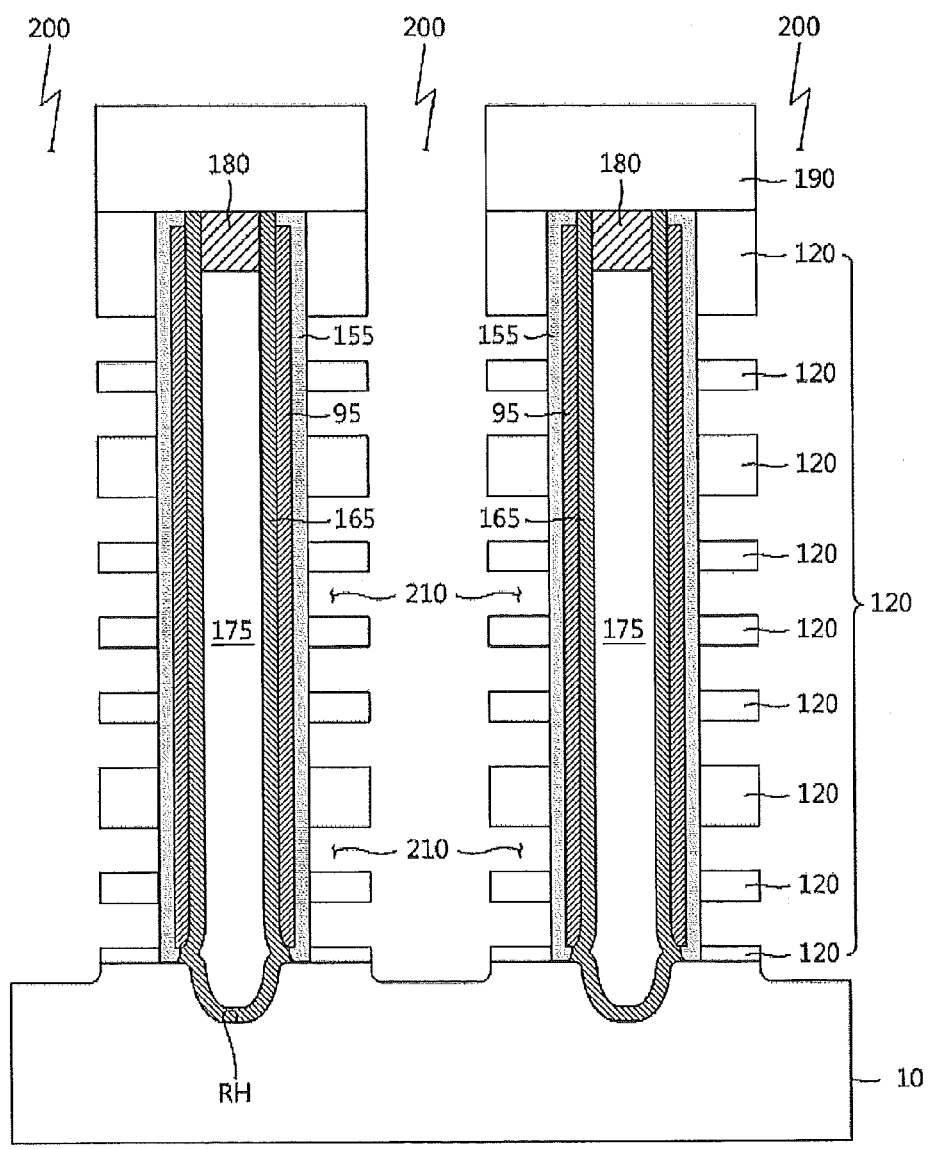
Figure 39:
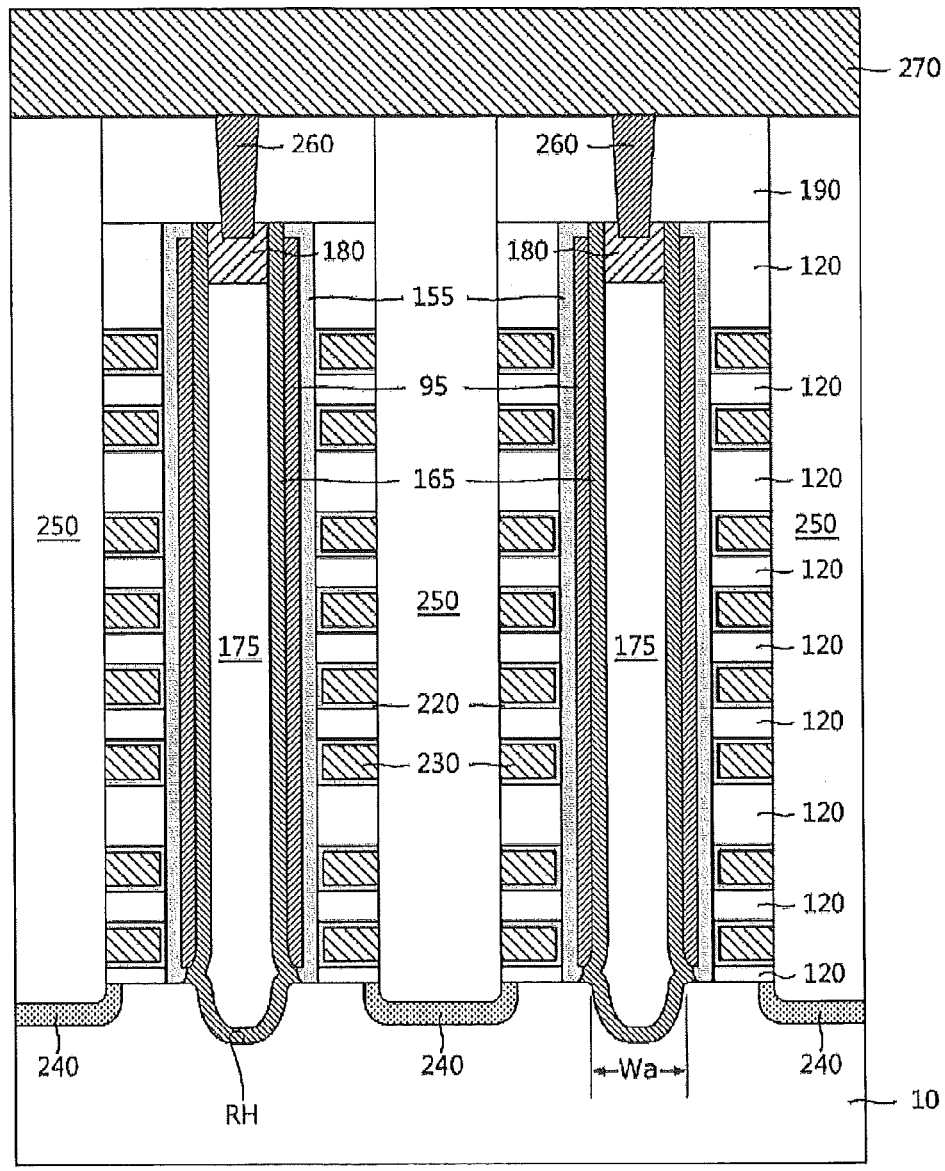

FIGS. 37 to 39 are sectional views illustrating a method of fabricating a 3D semiconductor device, according to a fourth embodiment configured to realize at least one of the above-described various aspects of the inventive concept. For brevity's sake, descriptions of technical features duplicated with the above-described fabrication methods may be omitted.

Referring to FIG. 37, a stacked layer structure 100 in which openings 105 are formed is formed on a substrate 10 using the fabrication method described with reference to FIGS. 21 and 22. Thereafter, an undercut region UC that is a gap region horizontally extending from the opening 105 is formed. Sequentially, an insulating spacer 155, an auxiliary spacer 95, and a semiconductor pattern 165, which fill the undercut region UC and the opening 105, are formed using the fabrication method described with reference to FIGS. 17 to 20. Thus, as shown in FIG. 37, the semiconductor pattern 165 covers the entire inner wall of a recess hole RH, and the insulating spacer 155 is locally formed within the undercut region UC. In addition, a gap-fill pattern 175 and a pad pattern 180 filling the opening 105 in which the semiconductor pattern 165 is formed are sequentially formed using the fabrication method described with reference to FIGS. 22 and 23. Referring to FIG. 38, trenches 200 passing through the stacked layer structure 100 are formed, and then, sacrificial layers 130 are removed to form recess regions 210 exposing a sidewall of the insulating spacer 155. This process may be performed using the fabrication method described with reference to FIGS. 24 and 25.

According to the present embodiment, the insulating spacer 155 may be used as an element for storing information. In this case, the insulating spacer 155 may include at least one of at least one tunnel insulation layer, at least one charge storage layer, and at least one blocking insulation layer. The tunnel insulation layer may be disposed between the charge storage layer and the semiconductor pattern 165, and the blocking insulation layer may be disposed between the charge storage layer and the conductive pattern 230.

The charge storage layer may be one of insulation layers having sufficient trap sides and insulation layers having nano particles. Also, the charge storage layer may be formed using one of CVD or ALD technologies. For example, the charge storage layer may include one of 1) a trap insulation layer and 2) an insulating layer including a floating gate electrode or conductive nano-dots. Concretely, the charge storage layer may include at least one of a silicon nitride layer, a silicon oxynitride, a silicon-rich nitride layer, a nano-crystalline silicon layer, and a laminated trap layer.

The tunnel insulation layer may be formed of one of materials having a band gap greater than that of the charge storage layer. For example, the tunnel insulation layer may be a silicon oxide layer formed using one of the CVD or ALD technologies. The blocking insulation layer may be formed of one of materials having a band gap less than that of the tunnel insulation layer and greater than that of the charge storage layer. For example, the blocking insulation layer may include high-k dielectrics such as an aluminum oxide layer and a hafnium oxide layer. According to modified embodiments, like the foregoing embodiments, the insulating spacer 155 may serve as an etch-stop layer, which prevents the auxiliary spacer 95 from being etched during the formation of the recess regions 210.

Referring to FIG. 39, an information storage layer 220 covering the inner wall of the recess region 210 and a conductive pattern 230 filling a remaining space of the recess region 210 are formed. Then, electrode separation patterns 250 filling the trenches 200, upper plugs 260 respectively connected to the pad patterns 180, and upper wires 270 connecting the upper plugs 260 to each other are sequentially formed. A process of forming impurity regions 240 may be further performed before the electrode separation patterns 250 are formed. These processes may be performed using the fabrication method described with reference to FIGS. 26 and 27.

Figure 40:
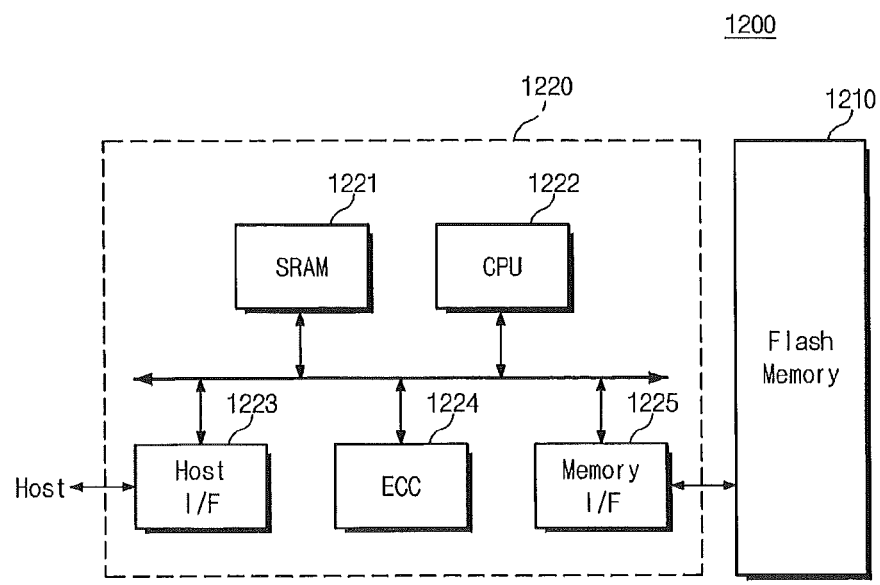
FIG. 40 is a schematic block diagram illustrating an example of a memory card including a FLASH memory device according to the inventive concept.

FIG. 40 is a schematic block diagram illustrating an example of a memory card 1200 including a FLASH memory device according to the inventive concept. Referring to FIG. 40, the memory card 1200 for supporting large capacity data storage performance includes a FLASH memory device 1210 according to the inventive concept. The memory card 1200 according to the inventive concept includes a memory controller 1220 which controls various data exchange between a host and the FLASH memory device 1210.

An SRAM 1221 is used as an operation memory of a processing unit 1222. A host interface 1223 includes a data exchange protocol of the host connected to the memory card 1200. An error correction block 1224 is configured to detect and correct errors in data read from the multi-bit FLASH memory device 1210. The memory interface 1225 interfaces with the FLASH memory device 1210 according to the inventive concept. The processing unit 1222 performs a general control operation for exchanging data with the memory controller 1220. Although not shown, it is apparent to those skilled in the art that the memory card 1200 according to the inventive concept further include a ROM (not shown) that stores code data for interfacing with the host.

According to the FLASH memory device and the memory card or memory system of the inventive concept, a memory system having a high reliability may be provided through the FLASH memory device 1210 in which an erase characteristic of dummy cells is improved. Particularly, the FLASH memory device according the inventive concept may be provided in a memory system such as a solid state disk (SSD) that is under active research and development. In this case, a reading error occurring from the dummy cells may be interrupted to realize the memory system having the high reliability.

Figure 41:
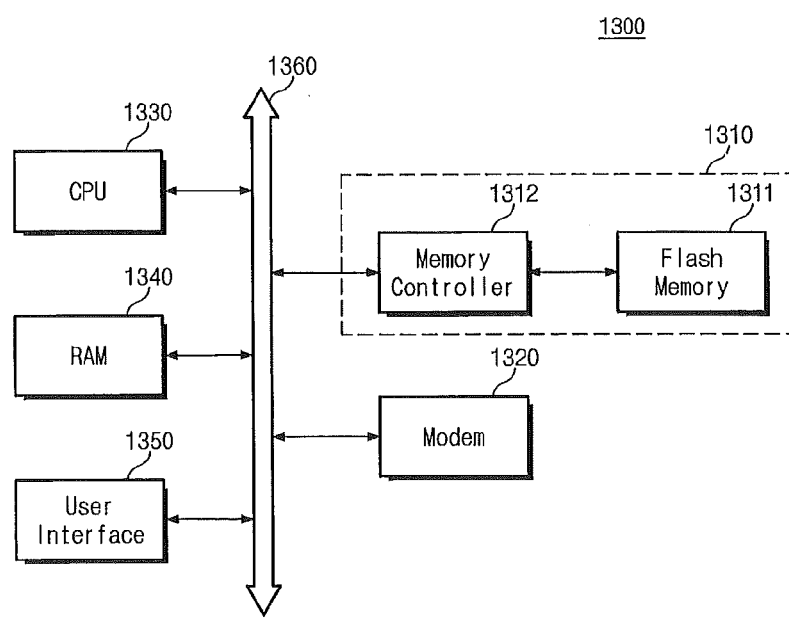
FIG. 41 is a schematic block diagram of an information processing system including a memory system according to the inventive concept.

FIG. 41 is a schematic block diagram illustrating an example of an information processing system 1300 including a FLASH memory device 1310 according to the inventive concept. Referring to FIG. 41, the FLASH memory system 1310 according to the inventive concept is provided to the information processing system 1300 such as a mobile device or a desk top computer. The information processing system 1300 according to the inventive concept includes a FLASH memory system 1310 and a modem 1320, a central processing unit 1330, a RAM 1340, and a user interface 1350, which are electrically connected to a system bus 1360. The FLASH memory system 1310 has the substantially same configuration as that of the above-described memory system or FLASH memory system. Data processed by the central processing unit 1330 or data inputted from the outside is stored in the FLASH memory system 1310. Here, the above-described FLASH memory system 1310 may be configured as a semiconductor disk device (SDD). In this case, the information processing system 1300 may stably store large capacity data to the FLASH memory system 1310. As reliability of the FLASH memory system 1310 is increased, the FLASH memory system 1310 may reduce resources required for correcting errors to provide a high-speed data exchange function to the information processing system 1300. Although not shown, it is apparent to those skilled in the art that the information processing system 1300 may further include an application chipset, a camera image processor (CIS), an input/output unit and the like.

Also, the FLASH memory device or memory system according to the inventive concept may be mounted in various forms of packages. For example, the FLASH memory device or memory system may be mounted in various types of packages such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

According to an aspect of the inventive concept, the insulating spacer serving as the etch stop layer is formed on the inner wall of the opening. Thus, sidewall recess of the semiconductor pattern may be effectively prevented during the process of removing the sacrificial layer. According to another aspect of the inventive concept, the insulating spacer is locally formed in the undercut region around the opening. Thus, the entire inner wall of the recess hole, which may be formed in the substrate or the under-structure, can be in direct contact with the semiconductor pattern. In this case, a technical problem in which a current path via the semiconductor pattern is longer may be prevented. The localization of the insulating spacer can be realized through the method using the spatial difference of the etch rate caused by the spatial difference of the impurity concentration or the method using the auxiliary spacer as the etch mask. According to a further aspect of the inventive concept, the insulating spacer is used as the underlayer of the semiconductor pattern or the auxiliary spacer. In this case, the insulating spacer used as the underlayer may be formed to have physical properties, which can improve the incubation time and thickness uniformity of the semiconductor pattern or the auxiliary spacer. For example, as described in the some embodiments, the insulating spacer may be formed of oxide containing nitrogen, silicon oxynitride, or silicon nitride.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of fabricating a nonvolatile memory device, comprising:
    forming a stack including first layers and second layers stacked in an alternating sequence, on a substrate, the first layers and the second layers comprising different materials;
    forming an opening penetrating through the stack;
    horizontally etching sidewalls of the second layers exposed by the opening to form an expanded opening;
    forming an insulating protective pattern covering an inner sidewall of the expanded opening;
    forming a semiconductor pattern in the expanded opening on the insulating protective pattern, the insulating protective pattern extending between the stack and the semiconductor pattern;
    forming a trench penetrating through the stack, the trench being spaced apart from the extended opening;
    removing the second layers exposed by the trench to form recess regions between the first layers, the recess regions exposing portions of the insulating protective pattern; and
    forming conductive patterns in the respective recess regions.

2. The method of claim 1, wherein the stack further comprises a capping mask layer provided at an uppermost position thereof, and
    the expanded opening is formed by horizontally etching sidewalls of the first and second layers using the capping mask layer as an etch mask.

3. The method of claim 2, wherein the first layers, the second layers, and the capping mask layer comprise one of silicon oxide, silicon nitride, silicon oxynitride, silicon germanium, silicon, and carbide, and
    the capping mask layer is formed of a different material from both of the first and second layers.

4. The method of claim 1, wherein horizontally etching the sidewalls of the second layers comprises recessing the side walls of the second layers using an etch recipe having etch selectivity with respect to the first layers, such that the expanded opening comprises recesses between the first layers.

5. The method of claim 1, wherein forming the insulating protective pattern comprises:
    lining the expanded opening with an insulating layer; and
    removing the insulating layer from a bottom of the expanded opening to form the insulating protective pattern localized on the inner sidewall of the expanded opening.

6. The method of claim 5, wherein removing the insulating layer from the bottom of the expanded opening comprises:
    conformally forming an additional mask layer on the insulating layer;
    patterning the additional mask layer to form an additional protective pattern exposing a portion of the insulating layer on the bottom of the expanded opening;
    etching the insulating layer using the additional protective pattern as an etch mask.

7. The method of claim 6, wherein horizontally etching the sidewalls of the second layers comprises recessing sidewalls of the second layers to a depth that is greater than a thickness of the insulating layer and is smaller than a sum of the thickness of the insulating layer and a thickness of the additional mask layer.

8. The method of claim 5, wherein the insulating layer has different impurity concentrations on the bottom of the expanded opening and on the inner sidewall of the expanded opening, and
    removing the insulating layer comprises performing an etching that etches the insulating layer with different etch rates according to the different impurity concentrations.

9. The method of claim 5, further comprising, injecting impurities into the insulating layer, wherein injecting the impurities is performed in such a way that the insulating layer on the bottom of the expanded opening has a impurity concentration higher than that of the insulating layer on the inner sidewall of the expanded opening, and removing the insulating layer comprises performing an isotropic etching that etches the insulating layer with different etch rates depending on impurity concentrations therein.

10. The method of claim 9, wherein injecting the impurities comprises injecting ions, whose propagation direction is perpendicular to a top surface of the substrate.

11. The method of claim 5, wherein removing the insulating layer comprises anisotropically etching the insulating layer and then isotropically etching the insulating layer, and anisotropically etching the insulating layer selectively etches a portion of the insulating layer on the bottom of the expanded opening.

12. The method of claim 1, wherein the insulating protective pattern is formed of at least one of a nitrogen-containing silicon oxide layer, a silicon oxynitride layer, a silicon nitride layer, or any combination thereof.

13. The method of claim 1, wherein the substrate comprises a recess hole formed below the expanded opening, and an inner wall of the recess hole is in direct contact with the semiconductor pattern.

14. The method of claim 1, wherein the insulating protective pattern is formed of a material having etch selectivity with respect to the second layers, thereby preventing the semiconductor pattern from being damaged during the forming of the recess regions.

15. The method of claim 1, further comprising, before the forming of the conductive patterns, forming a horizontal layer to conformally cover inner walls of the recess regions, wherein the horizontal layer comprises at least one of silicon oxide, silicon nitride, or high-k dielectrics.

16. The method of claim 1, further comprising, before forming the conductive patterns, etching the portions of the insulating protective pattern exposed by the respective recess regions to expose the semiconductor pattern.

17. The method of claim 1, wherein the conductive patterns are formed to cover the portions of the insulating protective pattern exposed by the respective recess regions, and the insulating protective pattern is interposed between the semiconductor pattern and the conductive patterns.

18. A method of fabricating a nonvolatile memory device, comprising:

forming a stack including a plurality of first layers and a plurality of second layers arranged in an alternating sequence, on a substrate, the pluralities of first and second layers comprising different materials;

forming an opening penetrating through the stack;

horizontally etching sidewalls of the plurality of second layers exposed by the opening to from an expanded opening;

forming an insulating protective pattern covering a sidewall of the expanded opening;

forming a semiconductor pattern in the expanded opening on the insulating protective pattern, the insulating protective pattern extending between the stack and the semiconductor pattern;

forming a trench penetrating through the stack, the trench being spaced apart from the extended opening;

removing the plurality of second layers exposed by the trench to form a plurality of recess regions between the plurality of first layers; and forming a plurality of conductive patterns in respective ones of the plurality of recess regions, the plurality of conductive patterns covering portions of the insulating protective pattern exposed by the respective ones of the plurality of recess regions.

* * * * *